(12) United States Patent
Park et al.

(10) Patent No.: US 12,704,919 B2
(45) Date of Patent: Aug. 11, 2026

(54) TRANSPARENT DISPLAY DEVICE WITH TOUCH SENSOR

(71) Applicant: LG Display Co., Ltd., Seoul (KR)

(72) Inventors: JaeHee Park, Paju-si (KR); MiReum Lee, Paju-si (KR); Dojin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 19/039,543

(22) Filed: Jan. 28, 2025

(65) Prior Publication Data

US 2025/0173015 A1 May 29, 2025

Related U.S. Application Data

(63) Continuation of application No. 18/387,639, filed on Nov. 7, 2023, now Pat. No. 12,242,682.

(30) Foreign Application Priority Data

Jan. 30, 2023 (KR) ........................ 10-2023-0011896

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC ......... G06F 3/044–0448; G06F 3/0412; G06F 3/04164
See application file for complete search history.

(56) References Cited

U.S. PATENT DOCUMENTS 7,902,746 B2 * 3/2011 Park .................... H10K 59/123 313/506
10,108,290 B2 * 10/2018 Hwang ................. H10K 59/40
(Continued)

FOREIGN PATENT DOCUMENTS

CN 106653791 A 5/2017
JP 2017-120771 A 7/2017
(Continued)

*Primary Examiner* — Patrick F Marinelli
(74) *Attorney, Agent, or Firm* — Birch, Stewart, Kolasch & Birch, LLP

(57) ABSTRACT

A transparent display device with a touch sensor can include subpixels in a substrate having a light emitting element with an anode electrode, a light emitting layer, and a cathode electrode, a first area in the substrate including a non-light emission area, a second area in the substrate including a transmissive area, and an opening area on the second area. Also, the transparent display device can include a driving transistor, a planarization layer on the driving transistor in which the light emitting element is on the planarization layer, a bank on the anode electrode, an encapsulation layer on the light emitting element that includes one inorganic layer and one organic film, and color filters in the subpixels, and a black matrix between the color filters. Also, the black matrix overlaps the bank, and a portion of the cathode electrode is separated by the opening area in the second area.

25 Claims, 16 Drawing Sheets

(51) Int. Cl.
*G09G 3/3225* (2016.01)
*H10K 59/40* (2023.01)
*H10K 59/88* (2023.01)

(52) U.S. Cl.
CPC ............. *H10K 59/40* (2023.02); *H10K 59/88* (2023.02); *G06F 2203/04107* (2013.01); *G09G 3/3225* (2013.01); *G09G 2300/0426* (2013.01)

(56) References Cited

U.S. PATENT DOCUMENTS 10,418,430 B2 * 9/2019 Choi .................... H10K 59/122
10,468,469 B2 * 11/2019 Tsai ........................ G06F 3/044
10,877,584 B2 * 12/2020 Lee ....................... G06F 3/0412
11,073,928 B2 * 7/2021 Lee ....................... G06F 3/0446
11,114,523 B2 * 9/2021 Park ..................... H10K 59/121
11,296,156 B2 * 4/2022 Kim ..................... H10K 50/805
11,327,592 B2 * 5/2022 Lee ....................... G06F 3/0445
11,387,437 B2 * 7/2022 Zhang .................. H10K 59/122
11,574,985 B2 * 2/2023 Koh ..................... H10K 59/124
11,886,653 B2 * 1/2024 Im ........................ H10K 59/126
11,895,876 B2 * 2/2024 Choi .................... H10K 59/124
11,907,469 B2 * 2/2024 Han ..................... H10K 59/124
11,928,285 B2 * 3/2024 Park .................... G06F 3/04164
11,930,657 B2 * 3/2024 Jo ........................ H10K 59/122
11,930,688 B2 * 3/2024 Sung ..................... G06F 3/0412
11,960,676 B2 * 4/2024 Park ...................... G06F 3/0412
11,968,877 B2 * 4/2024 Yun ....................... G06F 3/0443
11,977,697 B2 * 5/2024 Im ......................... G06F 3/0416
11,995,257 B2 * 5/2024 Kim ...................... G06F 3/0412
12,011,122 B2 * 6/2024 An ......................... A47K 10/48
12,101,984 B2 * 9/2024 Shin ....................... G01N 21/78
2010/0013379 A1 * 1/2010 Park ..................... H10K 59/123
445/24
2014/0104771 A1 * 4/2014 Colan .................... G08C 17/02
361/679.4
2015/0062137 A1 * 3/2015 Yu ........................ G09G 3/3233
345/531
2016/0349899 A1 * 12/2016 Hwang ............... G06F 3/04164
2017/0147116 A1 * 5/2017 Lee ....................... G06F 3/0446
2018/0095566 A1 * 4/2018 Lee ....................... G06F 3/0412
2018/0351126 A1 * 12/2018 Choi .................... H10K 59/122
2019/0058020 A1 * 2/2019 Tsai ........................ G06F 3/044
2019/0181205 A1 * 6/2019 Kim ..................... H10K 59/124
2019/0189717 A1 * 6/2019 Choi .................... H10K 59/122
2020/0136068 A1 4/2020 Lee et al.
2020/0161382 A1 * 5/2020 Lee ........................ H10K 59/40
2020/0168670 A1 * 5/2020 Kim ................... H10K 59/1213
2020/0176551 A1 * 6/2020 Park ....................... H10K 50/86
2020/0258960 A1 * 8/2020 Choi .................... H10K 59/121
2021/0143365 A1 * 5/2021 Jo ........................ H10K 59/122
2021/0202670 A1 * 7/2021 Koh ..................... H10K 59/124
2021/0325990 A1 * 10/2021 Lee ....................... G06F 3/0445
2022/0093721 A1 3/2022 Kim et al.
2022/0190046 A1 * 6/2022 Kim ..................... H10K 59/122
2022/0208913 A1 6/2022 Lee et al.
2022/0208916 A1 6/2022 Kim et al.
2022/0208946 A1 * 6/2022 Kim ................... H10K 59/1315
2022/0302226 A1 * 9/2022 Shin ....................... G01N 21/78
2023/0033385 A1 * 2/2023 Park ...................... G06F 3/0412
2023/0172015 A1 * 6/2023 Lee ....................... G06F 3/0412
345/174
2023/0185391 A1 * 6/2023 Im ......................... G06F 3/0418
345/174
2023/0185392 A1 * 6/2023 Im ......................... G06F 3/0412
345/174
2023/0185415 A1 * 6/2023 Yun ....................... G06F 3/0446
345/174
2023/0195252 A1 * 6/2023 Park ...................... G06F 3/0443
345/173
2023/0195253 A1 * 6/2023 Park .................... G06F 3/04164
345/174
2023/0195257 A1 * 6/2023 Park .................... G06F 3/04164
345/174
2023/0200108 A1 * 6/2023 Kim ..................... H10K 50/824
257/40
2023/0200180 A1 * 6/2023 Park ...................... G06F 3/0412
345/173
2023/0200181 A1 * 6/2023 Park ...................... G06F 3/0446
345/173
2023/0209965 A1 * 6/2023 Yun ...................... H10K 59/351
345/173
2023/0214036 A1 * 7/2023 Kim ...................... G06F 3/0412
345/174
2023/0214038 A1 * 7/2023 Kim .................... G06F 3/04164
345/173
2023/0214039 A1 * 7/2023 Kim ...................... G06F 3/0412
345/173
2023/0214047 A1 * 7/2023 Han ..................... H10K 59/124
345/174
2023/0217779 A1 * 7/2023 Kim ...................... G06F 3/0443
257/72
2024/0045551 A1 * 2/2024 Kim ...................... G06F 3/0416
2024/0118761 A1 * 4/2024 Im ........................ H10K 59/126
2024/0138181 A1 * 4/2024 Jo ........................ H10K 59/122
2024/0138232 A1 * 4/2024 Shim .................. H10K 59/1315
2024/0160312 A1 * 5/2024 Lee ..................... G06F 3/04164
2024/0176448 A1 * 5/2024 Park .................... G06F 3/04164
2024/0211063 A1 * 6/2024 Lee ....................... G06F 3/0412
2024/0215374 A1 * 6/2024 Lee ...................... H10K 59/124
2024/0215379 A1 * 6/2024 Wu ...................... H10K 59/124
2024/0215383 A1 * 6/2024 Liu .................. H10K 59/80521
2024/0224660 A1 * 7/2024 Kim ....................... H10K 59/40
2025/0173015 A1 * 5/2025 Park ...................... G06F 3/0412
2025/0221186 A1 * 7/2025 Lee .................... H10K 59/8792
2025/0280704 A1 * 9/2025 Lee ...................... H10K 59/122

FOREIGN PATENT DOCUMENTS

JP 2022-105293 A 7/2022
KR 10-2020-0145366 A 12/2020
KR 10-2021-0084990 A 7/2021
KR 10-2021-0085495 A 7/2021
KR 10-2022-0072956 A 6/2022
TW 201913337 A 4/2019

* cited by examiner

FIG. 8

NTA1
NEA
TA
112
BM
150
140
130
131
125
PLN
PAS2
VDDL
PAS1
ILD
BF
111
II'
TL
OA1
UC11
OP1
TS
TSE
133
OP
UC1
CE
VSSL
II
Z
Y
X 112
150
140
130
125
PLN
PAS2
PAS1
ILD
BF
111
I'
NTA1
NEA
EA
NEA
TA
BM
CF
BM
GI
120
CH4
CE
P
RL
DL
DE1
GE1
ACT1
SE1
DTR
LS
DL
TL
VDDL
TL
TS
TSE
X
Z
Y

TRANSPARENT DISPLAY DEVICE WITH TOUCH SENSOR

CROSS-REFERENCE TO RELATED APPLICATION

This application is a Continuation of U.S. application Ser. No. 18/387,639, filed on Nov. 7, 2023 (now U.S. Pat. No. 12,242,682, issued on Mar. 4, 2025), which claims priority under 35 U.S.C. § 119 (a) to Korean Patent Application No. 10-2023-0011896, filed in the Republic of Korea on Jan. 30, 2023, all of these applications being incorporated by reference in their entirety into the present application.

BACKGROUND

Technical Field

The present disclosure relates to a transparent display device with a touch sensor.

Description of the Related Art

Recently, research has been conducted on a transparent display device which allows a user to see objects or items through the display device that are located on the opposite side. In a transparent display device, a display area for displaying an image can include a transmission area capable of transmitting ambient light (e.g., see-through portion) and a non-transmission area (e.g., area for the subpixels). The transparent display device can have a high light transmittance in the display area due to the transmission area.

The transparent display device can include a plurality of touch sensors and a plurality of touch lines to implement a touch function and touch sensing.

The transparent display device in the related art has technical problems in that it is not easy to form the plurality of touch sensors and the plurality of touch lines in the transparent display device, and a manufacturing process of forming the plurality of touch sensors and the plurality of touch lines can be complicated and expensive. Further problems include a light transmittance of the transparent display device being impaired due to the plurality of touch sensors and the plurality of touch lines. Further problems include electrodes for displaying an image, a plurality of driving lines, the plurality of touch sensors and touch lines for the touch that are disposed in a small area and might affect each other and introduce noise and parasitic capacitance, which can impair image quality and reduce accuracy of the touch sensing.

SUMMARY OF THE DISCLOSURE

The present disclosure has been made in view of the various technical problems in the related art including the above problems.

It is an object of the present disclosure to provide a transparent display device capable of minimizing a loss of light transmittance by a touch sensor and a touch line.

It is another object of the present disclosure to provide a transparent display device capable of preventing a short circuit defect and current leakage in an undercut area.

It is another object of the present disclosure to provide a transparent display device capable of preventing moisture permeated into an undercut area from being transferred to a light emitting element.

It is a further object of the present disclosure to provide a transparent display device capable of securing a touch sensing that has improved accuracy.

In accordance with an aspect of the present disclosure, the above and other objects can be accomplished by the provision of a transparent display device with a touch sensor including a substrate provided with a transmission area and a non-transmission area, a plurality of subpixels provided in the non-transmission area and configured to include a light emitting element with an anode electrode, a light emitting layer, and a cathode electrode, a touch sensor disposed in the transmission area and configured to include a touch sensor electrode, and an undercut structure for separating the cathode electrode constituting the light emitting element and the touch sensor electrode from each other, in which the undercut structure includes a plurality of inorganic layers including an opening area overlapping with an edge area of the touch sensor electrode and an organic pattern provided on the plurality of inorganic layers that is spaced apart from the plurality of subpixels.

In accordance with another aspect of the present disclosure, there is provided a transparent display device with a touch sensor comprising a substrate provided with a transmission area and a non-transmission area, a plurality of subpixels provided in the non-transmission area and configured to include a light emitting element having an anode electrode, a light emitting layer, and a cathode electrode, a touch sensor disposed in the transmission area and configured to include a touch sensor electrode, and an undercut structure configured to include a plurality of undercuts for separating the cathode electrode constituting the light emitting element and the touch sensor electrode from each other.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which:

FIG. 8 is a cross sectional view illustrating a first example along II-II' of FIG. 7 according to an embodiment of the present disclosure;

DETAILED DESCRIPTION OF THE EMBODIMENTS

Figure 1:
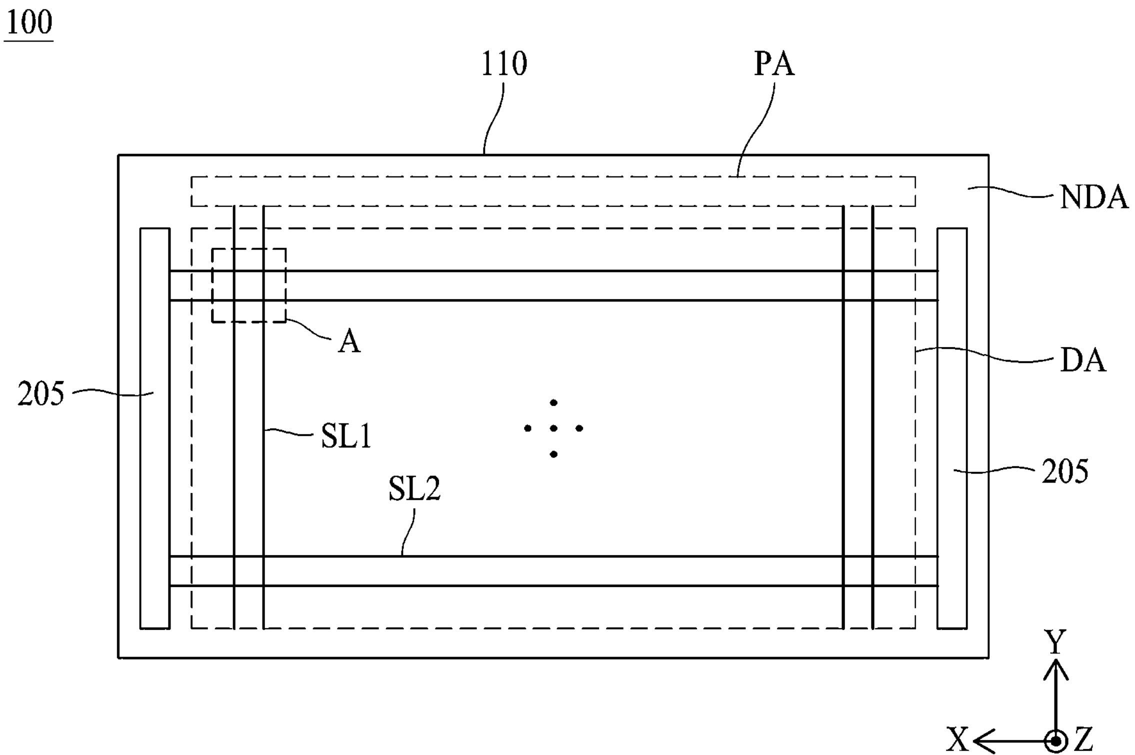
FIG. 1 is a plan view schematically illustrating a transparent display panel according to an embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, dimensions (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a situation where “comprise,” “have,” and “include” described in the present specification are used, another part can be added unless “only” is used. The terms of a singular form can include plural forms unless referred to the contrary.

In construing an element, the element is construed as including an error range although there is no explicit description.

In describing a position relationship, for example, when the position relationship is described as “upon~,” “above~,” “below,” and “next to,” one or more portions can be arranged between two other portions unless “just” or “direct” is used.

It will be understood that, although the terms “first,” “second,” etc., can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms “first,” “second,” etc., can be used. These terms are intended to identify the corresponding elements from the other elements, and basis, order, or number of the corresponding elements are not limited by these terms. The expression that an element is “connected” or “coupled” to another element should be understood that the element can directly be connected or coupled to another element but can directly be connected or coupled to another element unless specially mentioned, or a third element can be interposed between the corresponding elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship and are combinable.

FIG. 1 is a plan view schematically illustrating a transparent display panel.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 can be embodied as a liquid crystal display device, a plasma display panel (PDP), a Quantum dot Light Emitting Display (QLED) or an Electrophoresis display device.

Referring to FIG. 1, a transparent display device according to one embodiment of the present disclosure includes a transparent display panel 110. The transparent display panel 110 can include a display area DA provided with pixels to display an image, and a non-display area NDA for not displaying an image.

The display area DA can be provided with first signal lines SL1, second signal lines SL2 and the pixels. The non-display area NDA can be provided with a pad area PA in which pads are disposed, and at least one gate driver 205.

The first signal lines SL1 can be extended in a first direction (e.g., Y-axis direction). The first signal lines SL1 can cross the second signal lines SL2 in the display area DA. The second signal lines SL2 can be extended in the display area DA in a second direction (e.g., X-axis direction). The pixel can be provided in an area where at least one of the first signal line SL1 and the second signal line SL2 is provided, and emits predetermined light to display an image.

The gate driver 205 are connected to the scan lines and supplies scan signals to the scan lines. The gate driver 205 can be disposed in the non-display area NDA on one side or both sides of the display area DA of the transparent display panel 110 by a gate driver in panel (GIP) method or a tape automated bonding (TAB) method.

The transparent display panel 110 can further include a touch line and a touch sensor in addition to the first signal line SL1, the second signal line SL2 and the pixel in order to implement a touch function. A detailed description of the touch line and the touch sensor will be described later with reference to FIGS. 2 to 9.

Figure 2:
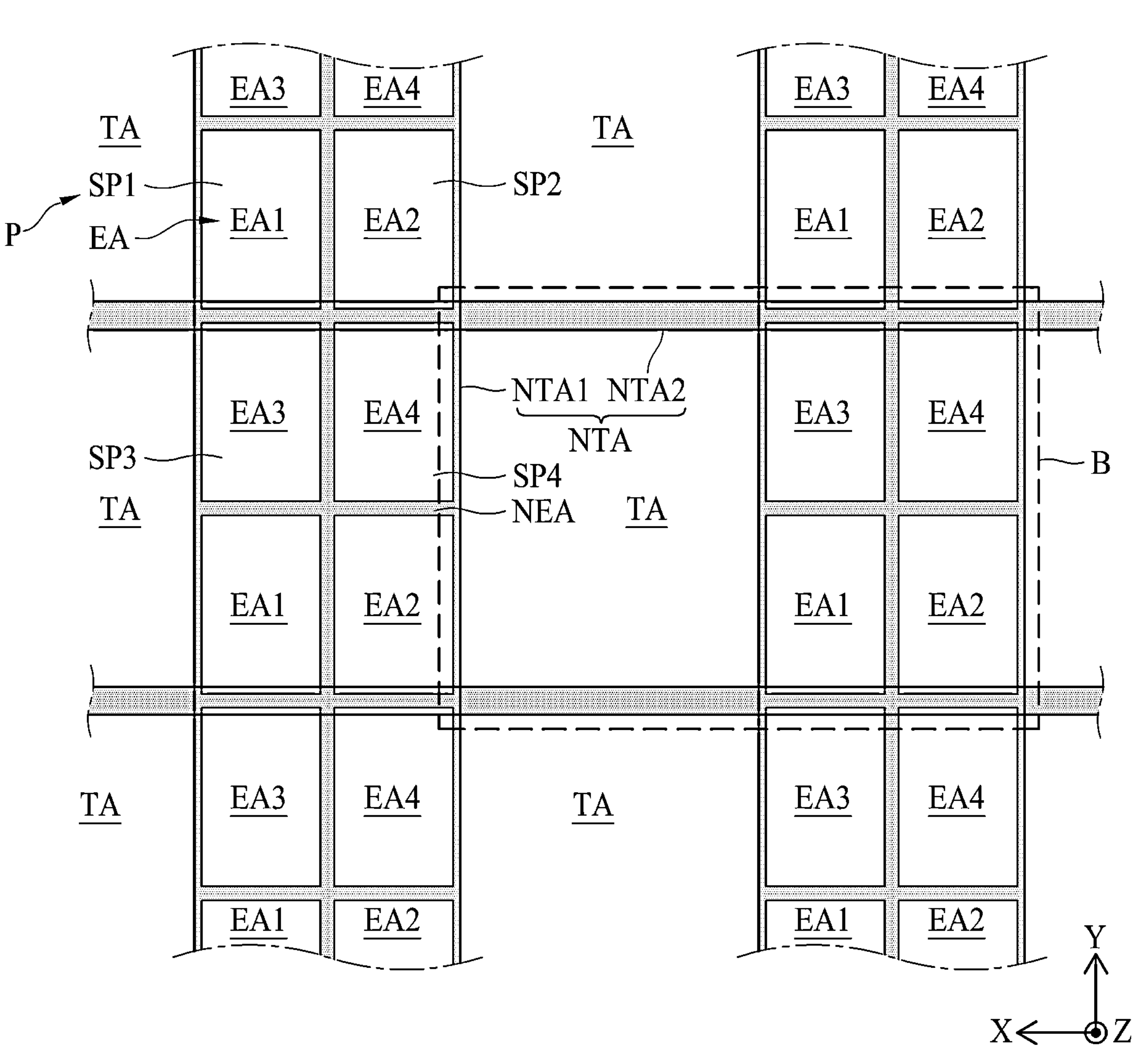
FIG. 2 schematically illustrates a pixel provided in 'A' of FIG. 1 according to an embodiment of the present disclosure.
Figure 3:
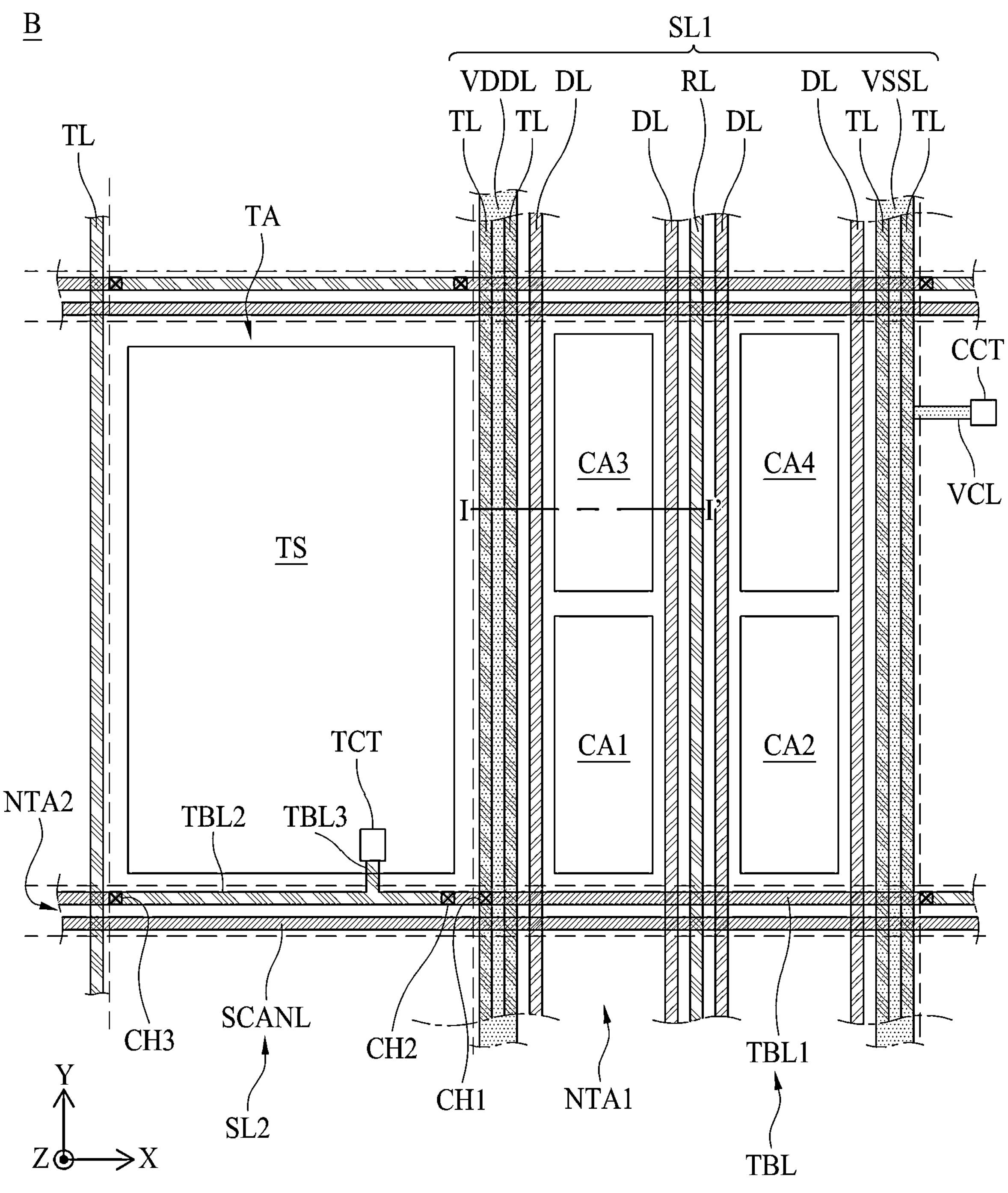
FIG. 3 illustrates one example of signal lines, touch lines, and a touch sensor provided in 'B' of FIG. 2 according to an embodiment of the present disclosure.

FIG. 2 schematically illustrates one embodiment of a pixel provided in 'A' of FIG. 1 according to an embodiment of the present disclosure, and FIG. 3 illustrates one example of signal lines, touch lines, and a touch sensor provided in 'B' of FIG. 2 according to an embodiment of the present disclosure.

The display area DA, as shown in FIG. 2, includes a transmissive area TA and a non-transmissive area NTA. The transmissive area TA is an area in which most of the externally incident light passes through, and the non-transmissive area NTA is an area through which most of the externally incident light fails to transmit through. For example, the transmissive area TA can be an area where light transmittance is greater than %, and the non-transmissive area NTA can be an area where light transmittance is less than β%, where a is greater than β. A user can view an object or background arranged at a rear surface of the transparent display panel 110 (e.g., behind the display panel) due to the transmissive area TA.

The non-transmissive area NTA can include a first non-transmissive area NTA1, a second non-transmissive area NTA2 and a plurality of pixels P. Pixels P can be provided to at least partially overlap with at least one of the first signal line SL1 and the second signal line SL2, thereby emitting predetermined light to display an image. A light emission area EA can correspond to an area, from which light is emitted, in the pixel P.

Each of the pixels P, as shown in FIG. 2, can include at least one of a first subpixel SP1, a second subpixel SP2, a third subpixel SP3 and a fourth subpixel SP4. The first subpixel SP1 can include a first light emission area EA1 emitting light of a first color. The second subpixel SP2 can include a second light emission area EA2 emitting light of a second color. The third subpixel SP3 can include a third light emission area EA3 emitting light of a third color. The fourth subpixel SP4 can include a fourth light emission area EA4 emitting light of a fourth color.

The first to fourth light emission area EA1, EA2, EA3 and EA4 can emit light of different colors. For example, the first light emission area EA1 can emit light of a green color. The second light emission area EA2 can emit light of a red color. The third light emission area EA3 can emit light of a blue color. The fourth light emission area EA4 can emit light of a white color. However, the light emission areas are not limited to this example. Also, the arrangement order of the subpixels SP1, SP2, SP3 and SP4 can be changed in various ways.

The first non-transmissive area NTA1 can be extended in a first direction (e.g., Y-axis direction) in a display area DA, and can be disposed to at least partially overlap light emission areas EA1, EA2, EA3 and EA4. A plurality of first non-transmissive areas NTA1 can be provided in the transparent display panel 110, and the transmissive area TA can be provided between two adjacent first non-transmissive areas NTA1. In the first non-transmissive area NTA1, first signals lines SL1 extended in the first direction (e.g., Y-axis direction) can be disposed to be spaced apart from each other.

For example, the first signal lines SL1 can include at least one of a pixel power line VDDL, a common power line VSSL, a reference line RL and data lines DL.

The pixel power line VDDL can supply a first power source to a driving transistor DTR of each of subpixels SP1, SP2, SP3 and SP4 provided in the display area DA.

The common power line VSSL can supply a second power source to a cathode electrode of the subpixels SP1, SP2, SP3 and SP4 provided in the display area DA. At this time, the second power source can be a common power source commonly supplied to the subpixels SP1, SP2, SP3 and SP4.

The common power line VSSL can supply the second power source to the cathode electrode through a cathode contact electrode CCT. The cathode contact electrode CCT can be provided between the transmissive area TA and the common power line VSSL. A power connection line VCL can be disposed between the common power line VSSL and the cathode contact electrode CCT. One end of the power connection line VCL can be connected to the common power line VSSL and the other end thereof can be connected to the cathode contact electrode CCT. The cathode electrode can be connected to the cathode contact electrode CCT. As a result, the cathode electrode can be electrically connected to the common power line VSSL through the power connection line VCL and the cathode contact electrode CCT.

According to one embodiment, the common power line VSSL, the power connection line VCL, and the cathode contact electrode CCT can be integrally formed in one layer, but is not limited thereto. According to another embodiment, the common power line VSSL, the power connection line VCL, and the cathode contact electrode CCT can be provided on different layers and can be electrically connected through a contact hole.

The reference line RL can supply an initialization voltage (or sensing voltage) to the driving transistor DTR of each of the subpixels SP1, SP2, SP3 and SP4 provided in the display area DA. The reference line RL can be disposed between the plurality of data lines DL. For example, the reference line RL can be disposed at the center of the four data lines DL, that is, between the second data line DL and the third data line DL.

The reference line RL can be diverged and connected to the plurality of subpixels SP1, SP2, SP3 and SP4. In detail, the reference line RL can be connected to circuit elements of the plurality of subpixels SP1, SP2, SP3 and SP4 to supply an initialization voltage (or sensing voltage) to each of the subpixels SP1, SP2, SP3 and SP4.

Each of the data lines DL can supply a data voltage to the subpixels SP1, SP2, SP3 and SP4. For example, one data line DL can supply a first data voltage to a first driving transistor of the first subpixel SP1, the other data line DL can supply a second data voltage to a second driving transistor of the second subpixel SP2. Another data line DL can supply a third data voltage to a third driving transistor of the third subpixel SP3 and another data line DL can supply a fourth data voltage to a fourth driving transistor of the fourth subpixel SP4.

The first signal lines SL1 can further include touch lines TL. In the transparent display panel 110 according to one embodiment of the present disclosure, the touch line TL can be further disposed in the first non-transmissive area NTA1.

At least two touch lines TL can be provided in the first non-transmissive area NTA1. When the plurality of touch lines TL are disposed in the transmissive area TA of the transparent display panel 110, light transmittance may be deteriorated or impaired due to the plurality of touch lines TL.

Also, a slit, specifically an elongated linear or rectangular shape, can be provided between the plurality of touch lines TL. When external light passes through the slit, a diffraction phenomenon can occur. According to the diffraction phenomenon, light corresponding to plane waves can be changed to spherical waves as the light passes through the slit, and an interference phenomenon can occur in the spherical waves. Therefore, constructive interference and destructive interference occur in the spherical waves, whereby the external light that has passed through the slit can have irregular light intensity. As a result, in the transparent display panel 110, the definition or clarity of an object or image positioned at an opposite side may be reduced or impaired (e.g., it may appear slightly fuzzy or cloudy). For this reason, there are some technical benefits to dispose the plurality of touch lines TL in the first non-transmissive area NTA1 rather than the transmissive area TA.

A plurality of touch lines TL can be disposed between first signal lines SL1 in the first non-transmissive area NTA1 and a transmissive area TA as shown in FIG. 3. For example, four touch lines TL can be disposed in one first non-transmissive area NTA1. Two touch lines TL can be disposed between the circuit areas CA1, CA2, CA3 and CA4 and the transmissive area TA disposed on the right of the circuit areas CA1, CA2, CA3 and CA4. The other two touch lines TL can be disposed between the circuit areas CA1, CA2, CA3 and CA4 and the transmissive area TA disposed on the left of the circuit areas CA1, CA2, CA3 and CA4, but are not limited to this arrangement. The plurality of touch lines TL are formed to not overlap with circuit areas CA1, CA2, CA3 and CA4 in which circuit elements are disposed, and various modifications can be made in the arrangement order of the plurality of touch lines TL with the first signal lines SL1.

The transparent display panel 110 according to one embodiment of the present disclosure is provided with a pixel P between adjacent transmissive areas TA. The pixel P can include light emission areas EA1, EA2, EA3 and EA4 in which a light emitting element is disposed to emit light. Since the non-transmissive area NTA in the transparent display panel 110 has a small area, a circuit element can be disposed to at least partially overlap with the light emission areas EA1, EA2, EA3 and EA4.

In the transparent display panel 110 according to one embodiment of the present disclosure, the plurality of touch lines TL do not overlap the circuit areas CA1, CA2, CA3 and CA4, whereby noise and parasitic capacitance of the touch lines TL due to the circuit elements can be prevented, reduced or minimized. Furthermore, the transparent display panel 110 according to one embodiment of the present disclosure can reduce a horizontal distance difference between the touch lines TL and improve uniformity of the parasitic capacitance.

The second non-transmissive area NTA2 can be extended in the display area DA in a second direction (e.g., X-axis direction), and can be disposed to at least partially overlap the light emission areas EA1, EA2, EA3 and EA4. A plurality of second non-transmissive areas NTA2 can be provided in the transparent display panel 110, and the transmissive area TA can be provided between two adjacent second non-transmissive areas NTA2. The second signal line SL2 can be disposed in the second non-transmissive area NTA2.

The second signal line SL2 is extended in a second direction (e.g., X-axis direction), and can include, for example, a scan line SCANL. The scan line SCANL can supply a scan signal to subpixels SP1, SP2, SP3 and SP4 of the pixel P.

The second signal line SL2 can further include a touch bridge line TBL. The touch bridge line TBL can connect any one of the plurality of touch lines TL with a touch sensor TS. The touch bridge line TBL can be connected to any one of the plurality of touch lines TL through a first contact hole CH1. The touch bridge line TBL can be connected to at least two touch sensors TS arranged in the second direction (e.g., X-axis direction) while being extended in the second direction (e.g., X-axis direction).

In the transparent display panel 110 according to one embodiment of the present disclosure, the plurality of touch lines TL can be disposed in the first non-transmissive area NTA1 that is not the second non-transmissive area NTA2, whereby light transmittance can be prevented from being deteriorated or impaired due to the plurality of touch lines TL. The second non-transmissive area NTA2 extended in the second direction (e.g., X-axis direction) crosses between adjacent transmissive areas TA as shown in FIG. 3. When a width of the second non-transmissive area NTA2 crossing the transmissive areas TA is increased, a size of the transmissive area TA is necessarily reduced.

When the plurality of touch lines TL are disposed in the second non-transmissive area NTA2, the width of the second non-transmissive area NTA2 is increased to dispose a large number of lines, and the size of the transmissive area TA is reduced. That is, a problem can occur in that light transmittance of the transparent display panel 110 is reduced due to the plurality of touch lines TL.

In the transparent display panel 110 according to one embodiment of the present disclosure, the plurality of touch lines TL are disposed in the first non-transmissive area NTA1, and only one touch bridge line TBL for connecting the plurality of touch sensors TS are provided in the second non-transmissive area NTA2. Therefore, the transparent display panel 110 according to one embodiment of the present disclosure can reduce or minimize the size decrease of the transmissive area TA or decrease in light transmittance due to the plurality of touch lines TL and the touch bridge line TBL.

The sensor TS can be provided in a transmission area TA. The touch sensor TS can be disposed in each of the plurality of transmission areas TA and can have a change in capacitance when a user contacts the touch sensor TS. A touch driver is connected to the plurality of touch sensors TS through a plurality of touch lines TL and can be configured to sense a change in capacitance of the plurality of touch sensors TS. The plurality of touch sensors TS can correspond to a plurality of pixels P by a one-to-one correspondence.

Hereinafter, a connection relationship between the plurality of touch sensors TS, the plurality of touch lines TL, and a plurality of touch bridge lines TBL will be described in more detail with reference to FIGS. 4 and 5.

Figure 4:
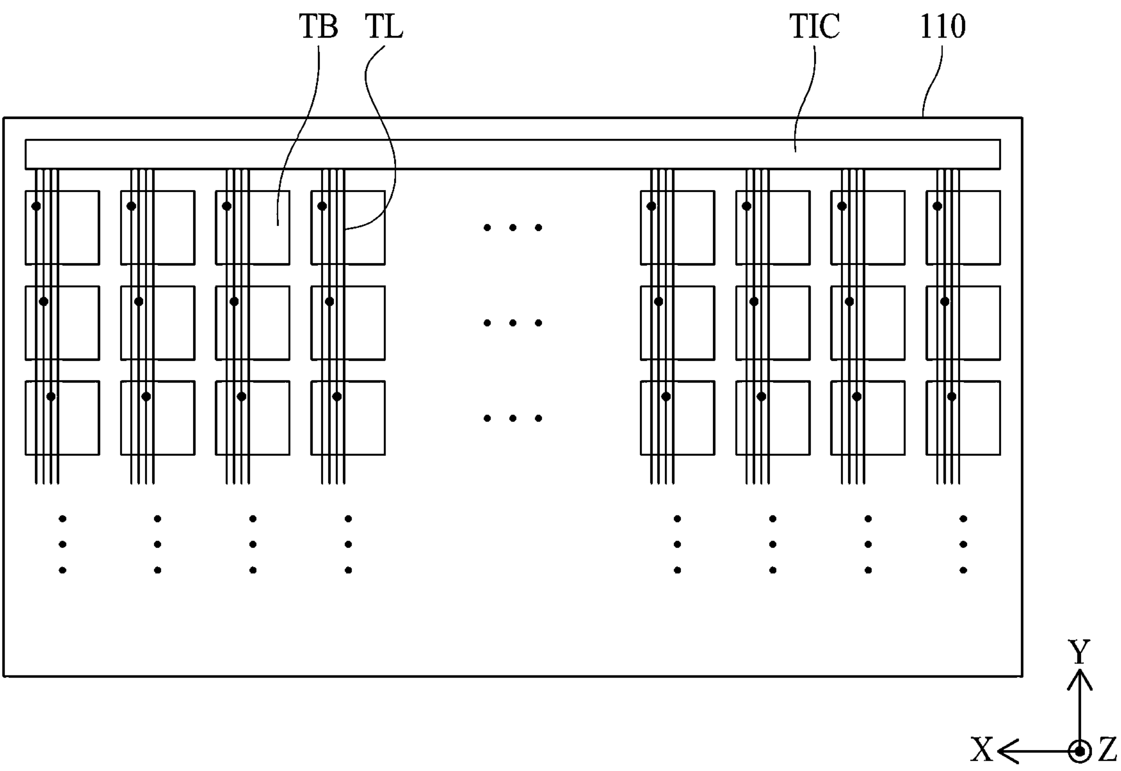
FIG. 4 illustrates a connection relationship between a plurality of touch blocks and the plurality of touch lines.
Figure 5:
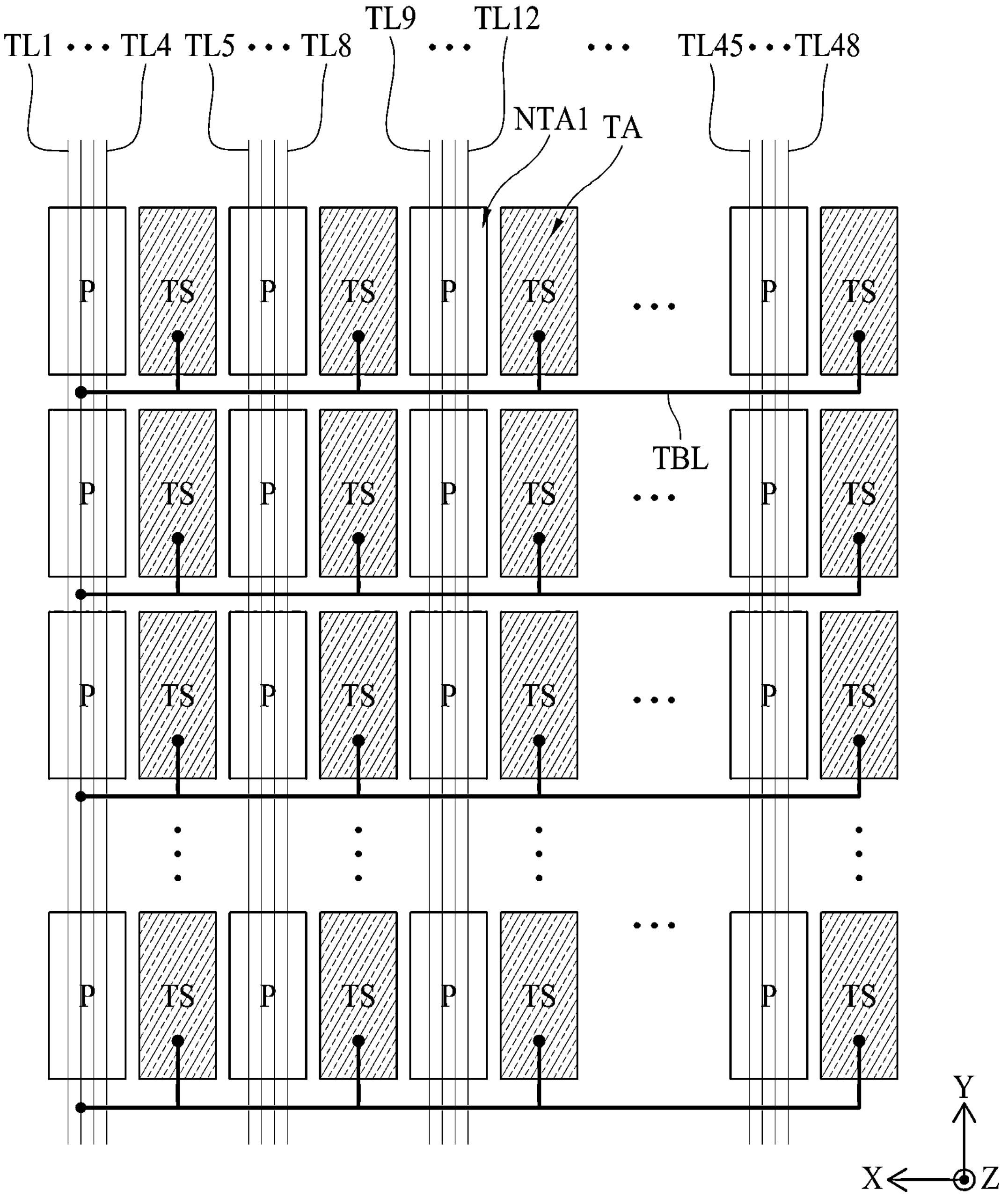
FIG. 5 illustrates a connection relationship between a plurality of touch lines and a plurality of touch sensors in one touch block according to an embodiment of the present disclosure.

FIG. 4 illustrates a connection relationship between a plurality of touch blocks and the plurality of touch lines, and FIG. 5 illustrates a connection relationship between the plurality of touch lines and the plurality of touch sensors in one touch block.

Referring to FIGS. 4 to 5, the transparent display panel 110 according to one embodiment of the present disclosure can include a plurality of touch blocks TB. Each of the plurality of touch blocks TB can include a plurality of pixels P and a plurality of transmissive areas TA disposed to correspond to the plurality of pixels P one-to-one as a basic unit for determining a user touch position.

The transparent display panel 110 according to one embodiment of the present disclosure can include a plurality of touch sensors TS provided in each the plurality of transmissive areas TA. For example, each of the plurality of touch blocks TB can include 12×20 pixels P and 12×20 touch sensors TS. In this situation, when image resolution is 1920×960, touch resolution can be 160×48.

In the transparent display panel 110 according to one embodiment of the present disclosure, as each of the plurality of touch lines TL is connected to one of the plurality of touch blocks TB, a change in capacitance of the touch sensors TS provided in the connected touch block TB can be sensed. That is, the plurality of touch lines TL provided in the transparent display panel 110 can correspond to the plurality of touch blocks TB one-to-one. Therefore, the number of touch lines TL can be the same as the number of touch blocks TB in the transparent display panel 110. For example, when the number of touch blocks TB is 160×48, the touch line TL can also be 160×48, and can be connected to the touch driver TIC.

As described above, in order to form as many touch lines TL as the number of touch blocks TB, at least two touch lines TL should be provided in one first non-transmissive area NTA1. For example, when image resolution is 1920×960 and touch resolution is 160×48, four touch lines TL can be provided in one first non-transmissive area NTA1, as shown in FIG. 3, in order to form 160×48 touch lines TL in the transparent display panel 110.

The plurality of touch sensors TS provided in one touch block TB can be connected to one of the plurality of touch lines TL provided in one touch block TB as shown in FIG. 5. For example, twelve first non-transmissive areas NTA1 can be provided in one touch block TB, and four touch lines TL can be disposed in each of the twelve first non-transmissive areas NTA1. As a result, one touch block TB can be provided with 48 touch lines TL1, . . . , TL48. In this situation, the plurality of touch sensors TS provided in one touch block TB can be connected to one specific touch line TL of the 48 touch lines TL1, . . . , TL48. At this time, the specific touch line TL can be connected to the plurality of touch sensors TS arranged in the second direction (e.g., X-axis direction) through the touch bridge lines TBL extended in the second direction (e.g., X-axis direction). As a result, the plurality of touch sensors TS provided in one touch block TB can be electrically connected to each other through the specific touch line TL and the touch bridge lines TBL.

Each of the plurality of touch lines TL can correspond to touch blocks TB on a one-to-one basis. Therefore, the plurality of touch blocks TB are connected to different touch lines TL and thus can be electrically separated from each other. Each touch line TL can connect a plurality of touch sensors TS provided in a corresponding touch block TB to a touch driver TIC. In detail, each touch line TL can transmit the changed capacitance provided from the touch sensors TS provided in the touch block TB to the touch driver TIC. The touch driver TIC can sense the changed capacitance, and can determine a touch position of a user. Also, each touch line TL can provide the touch sensing voltage generated from the touch driver TIC to the touch sensors TS provided in the touch block TB.

Hereinafter, light emitting elements of a light emitting area EA, the touch sensors TS of the transmission area TA, and an undercut structure will be described in more detail with reference to FIGS. 6 to 16.

Figure 6:
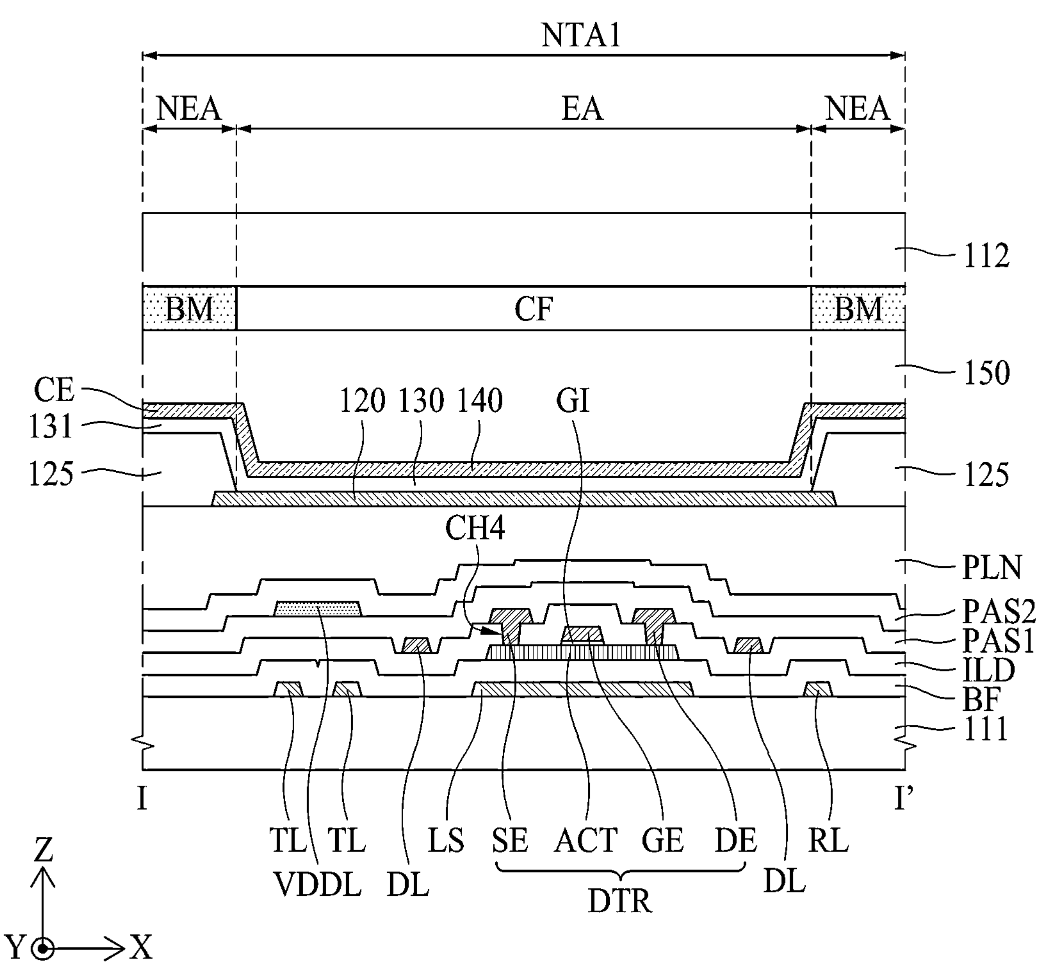
FIG. 6 is a cross sectional view illustrating an example along I-I' of FIG. 3 according to an embodiment of the present disclosure.
Figure 7:
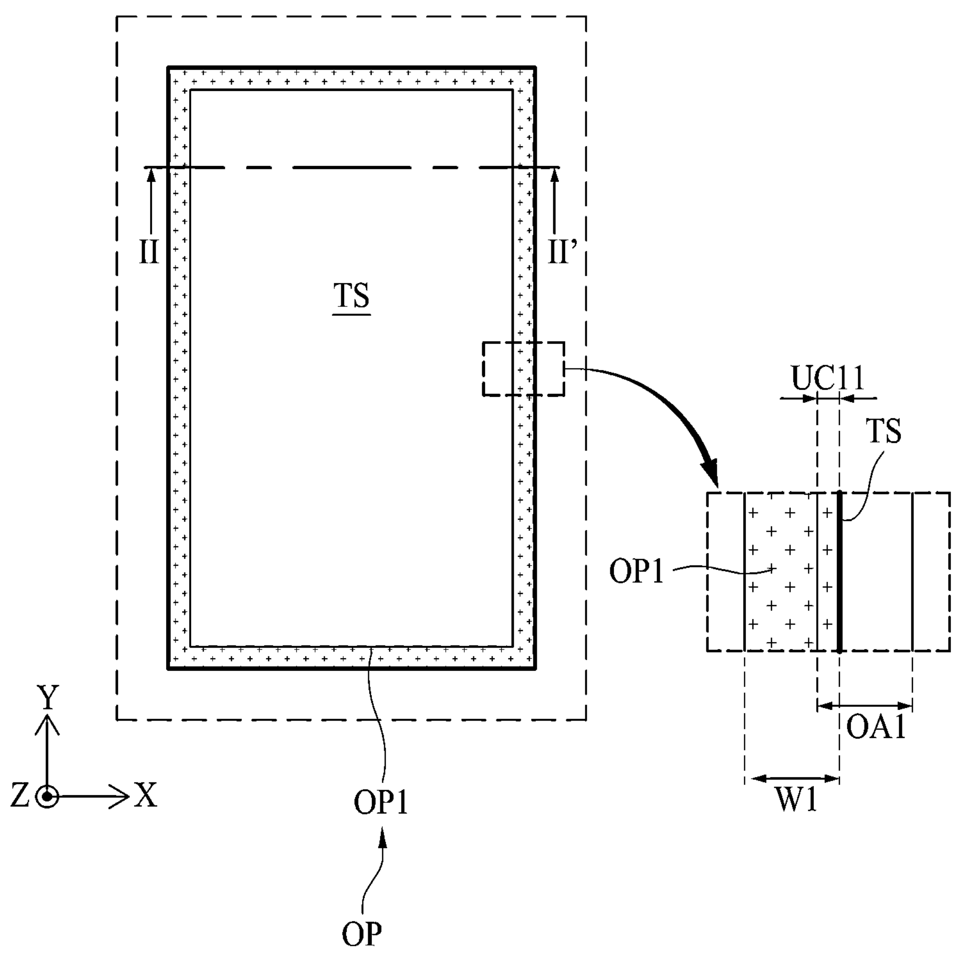
FIG. 7 is a plan view illustrating a first undercut structure and touch sensor shown in FIG. 3 according to an embodiment of the present disclosure.
Figure 8:
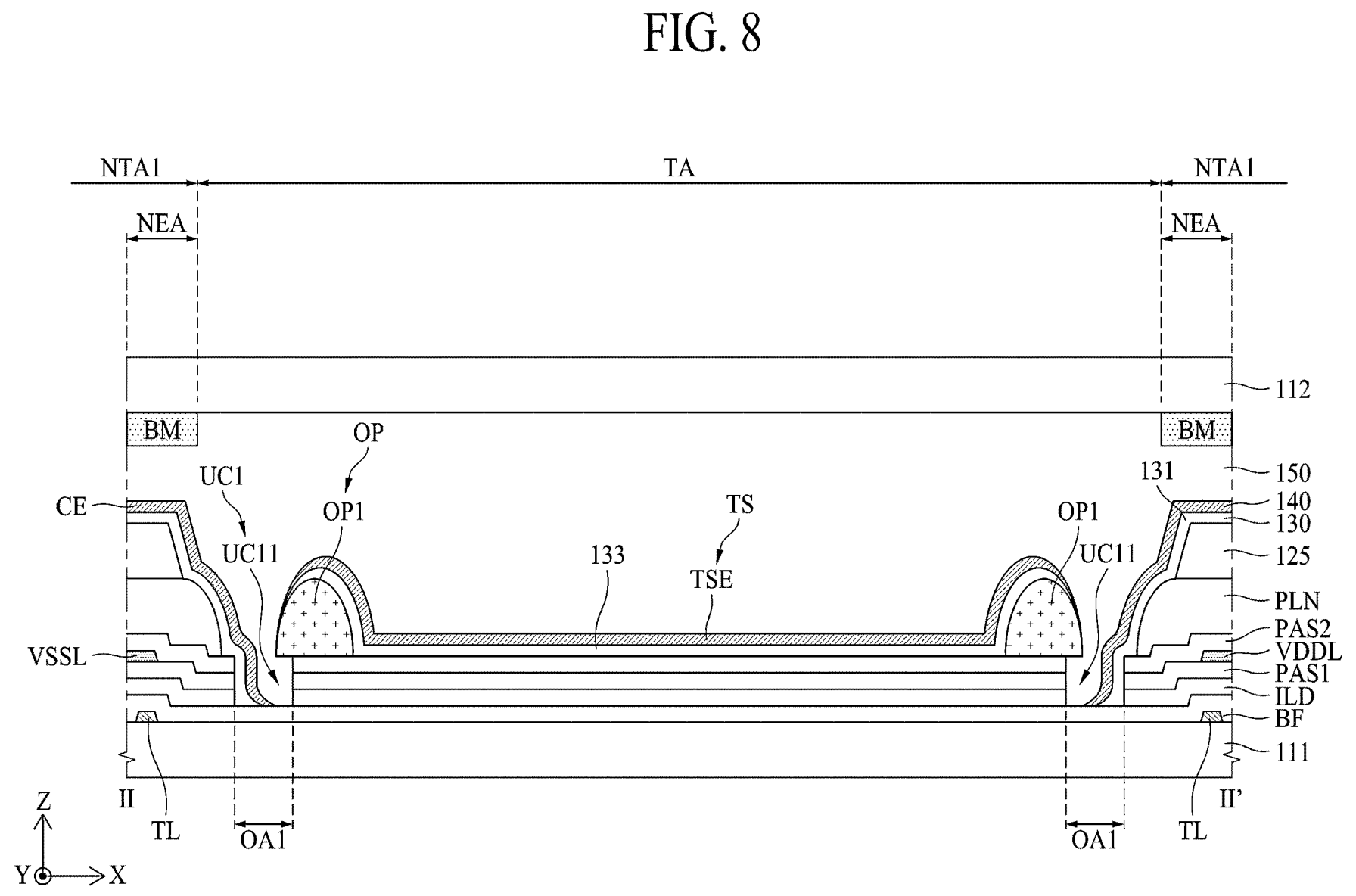
Figure 9:
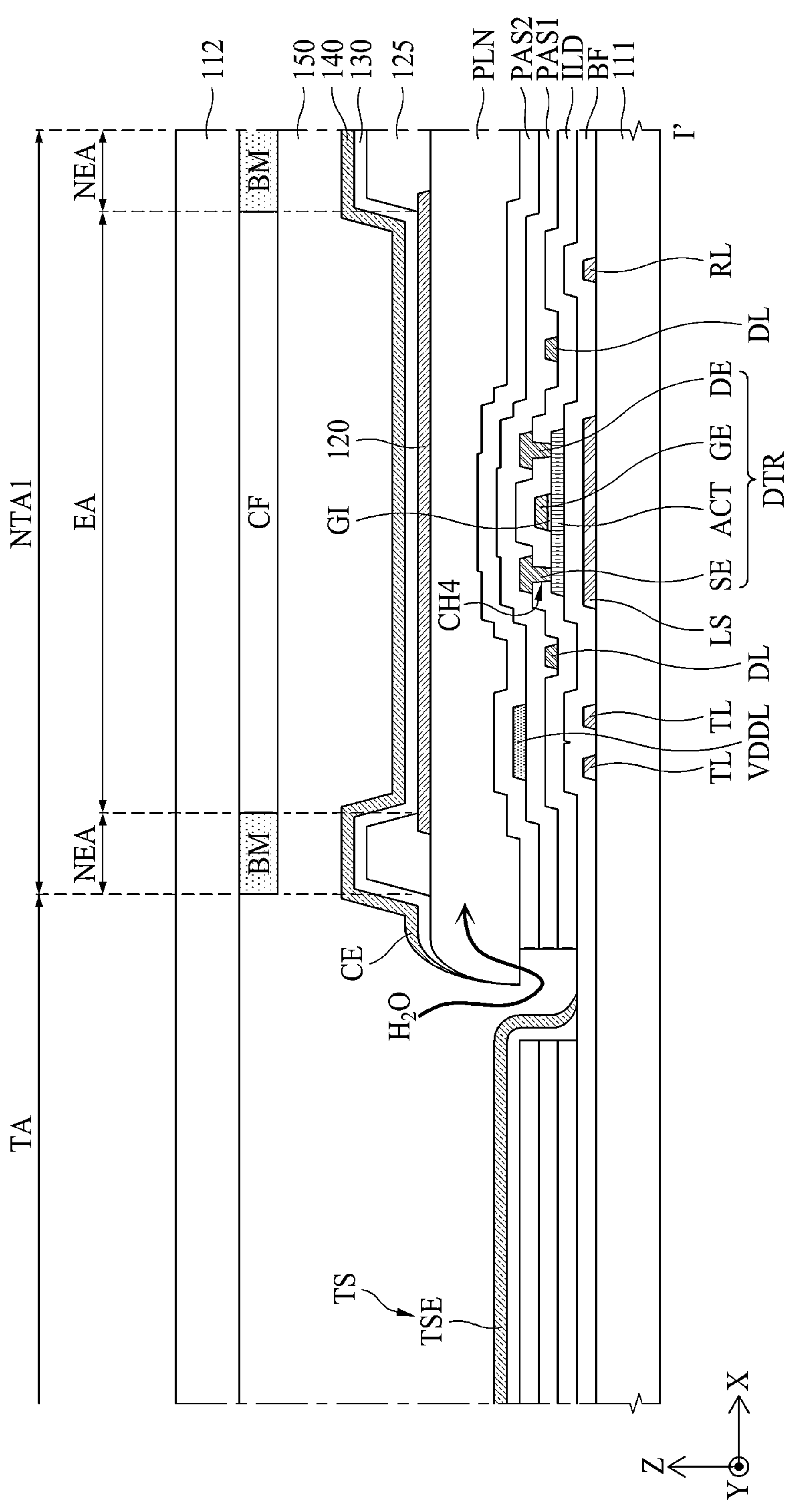
FIG. 9 illustrates an example in which moisture penetrates into a lower region of an undercut structure according to an embodiment of the present disclosure.

FIG. 6 is a cross sectional view illustrating an example along I-I' of FIG. 3 according to an embodiment of the present disclosure, FIG. 7 is a plan view illustrating a first embodiment showing a first undercut structure and touch sensor shown in FIG. 3 according to an embodiment of the present disclosure, FIG. 8 is a cross sectional view illustrating a first example along II-II' of FIG. 7 according to an embodiment of the present disclosure, and FIG. 9 illustrates an example in which moisture penetrates into a lower region of an undercut structure according to an embodiment of the present disclosure.

Referring to FIGS. 3 and 6 to 8, in the transparent display panel 110 according to one embodiment of the present disclosure, the first substrate 111 can include a plurality of transmission areas TA and a non-transmission area NTA including a plurality of light emitting areas EA disposed between adjacent transmission areas TA. The non-transmission area NTA can include a first non-transmission area NTA1 extending in a first direction (e.g., Y-axis direction) and a second non-transmission area NTA2 extending in a second direction (e.g., X-axis direction).

The first non-transmission area NTA1 can include circuit areas CA1, CA2, CA3, and CA4 in which at least one transistor and a capacitor are disposed. Also, the first non-transmission area NTA1 can be extended in the first direction (e.g., Y-axis direction), and can be provided with a pixel power line VDDL, a common power line VSSL, a reference line RL, data lines DL, touch lines TL, and a sensing line SSL disposed not to overlap the circuit areas CA1, CA2, CA3, and CA4. The second non-transmission area NTA2 can be provided with a scan line SCANL and a touch bridge line TBL extending in the second direction (e.g., X-axis direction).

The at least one transistor can include a driving transistor DTR and switching transistors. The switching transistor can be switched according to a scan signal supplied to the scan line SCANL and can be configured to charge the capacitor with a data voltage supplied from the data line DL.

The driving transistor DTR can be switched in accordance with the data voltage charged in the capacitor to generate a data current from a power source supplied from the pixel power line VDDL and supply the data current to a first electrode layer 120 of subpixels SP1, SP2, SP3 and SP4. The driving transistor DTR can include an active layer ACT, a gate electrode GE, a source electrode SE and a drain electrode DE.

In detail, as shown in FIG. 6, a light-shielding layer LS can be provided over the first substrate 111. The light-shielding layer LS can serve to shield external light incident on the active layer ACT in an area where the driving transistor DTR is formed (e.g., preventing the active layer from being damaged). The light-shielding layer LS can include a single layer or multi-layer made of any one of molybdenum (Mo), aluminum (Al), chromium (Cr), gold (Au), titanium (Ti), nickel (Ni), neodymium (Nd) and copper (Cu) or their alloy.

In the transparent display panel 110 according to one embodiment of the present disclosure, at least a portion of the pixel power line VDDL, the common power line VSSL, the reference line RL, the data lines DL, the touch lines TL and the touch bridge line TBL can be formed on the same layer as the light-shielding layer LS. For example, the reference line RL, the touch lines TL and the touch bridge line TBL can be formed of the same material as that of the light-shielding layer LS on the same layer as the light-shielding layer LS, but embodiments are not limited thereto.

A buffer layer BF can be provided over the light-shielding layer LS. The buffer layer BF is intended to protect the driving transistor DTR from moisture permeated through the first substrate 111 vulnerable to moisture permeation, and can include an inorganic layer, for example, a silicon oxide layer (SiOx), a silicon nitride layer (SiNx) or their multi-layer.

An active layer ACT of the driving transistor DTR can be provided over the buffer layer BF. The active layer ACT can be formed of a silicon-based semiconductor material or an oxide-based semiconductor material. For example, the active layer ACT of the driving transistor DTR can be formed of Indium Gallium Zinc Oxide IGZO. According to one embodiment of the present disclosure, the active layer ACT can be formed as a double layer. In this situation, the active layer ACT can include a first layer formed of a silicon-based semiconductor material or an oxide-based semiconductor material, and a second layer formed of ITO or IZO. For example, the active layer ACT of the driving transistor DTR can include the first layer made of Indium Gallium Zinc Oxide IGZO and the second layer made of IZO.

A gate insulating layer GI can be provided over the active layer ACT of the driving transistor DTR. The gate insulating layer GI can be patterned only in an area where the gate electrode GE is disposed. The gate insulating layer GI can include an inorganic layer, for example, a silicon oxide layer (SiOx), a silicon nitride layer (SiNx) or their multi-layer.

The gate electrode GE of the driving transistor DTR can be provided over the gate insulating layer GI. The gate electrode GE can include a single layer or multi-layer made of any one of molybdenum (Mo), aluminum (Al), chromium (Cr), gold (Au), titanium (Ti), nickel (Ni), neodymium (Nd) and copper (Cu) or their alloy.

An insulating interlayer ILD can be provided over the gate electrode GE of the driving transistor DTR. The insulating interlayer ILD can be provided in the non-transmission area NTA and the transmission area TA. As shown in FIGS. 7 and 8, in order to form a first undercut structure UC1 in the transmission area TA, a first opening area OA1 exposing the buffer layer BF can be formed. The insulating interlayer ILD can include an inorganic layer, for example, a silicon oxide layer SiOx, a silicon nitride layer SiNx, or a multilayer thereof. For example, a type of trench or moat can be formed around each touch sensor TS. Also, a large cathode layer can be laid down across the panel which can be effectively cut or split into different cathode portions by depressed areas in the insulating layers. In this way, the cathode layer can be divided into portions for touch sensors and portions for cathode electrodes for the subpixels.

A source electrode SE and a drain electrode DE of the driving transistor DTR can be disposed over the interlayer insulating layer ILD. The source electrode SE and the drain electrode DE of the driving transistor DTR can be connected to the active layer ACT of the driving transistor DTR through a fourth contact hole CH4 passing through the interlayer insulating layer ILD. The source electrode SE and the drain electrode DE can include a single layer or multi-layer made of any one of molybdenum (Mo), aluminum (Al), chromium (Cr), gold (Au), titanium (Ti), nickel (Ni), neodymium (Nd) and copper (Cu) or their alloy.

In the transparent display panel 110 according to one embodiment of the present disclosure, at least a portion of the pixel power line VDDL, the common power line VSSL, the reference line RL, the data lines DL, the touch lines TL and the touch bridge line TBL can be provided on the same layer as the source electrode SE and the drain electrode DE of the driving transistor DTR. For example, the data lines DL can be formed of the same material on the same layer as the source electrode SE and the drain electrode DE, but are not limited thereto.

A first passivation layer PAS1 for insulating the driving transistor DTR can be provided over the source electrode SE and the drain electrode DE of the driving transistor DTR, and a second passivation layer PAS2 can be provided over the first passivation layer PAS1.

Then, first and second passivation layers PAS1 and PAS2 can be provided in the non-transmission area NTA and the transmission area TA. As shown in FIGS. 7 and 8, the first and second passivation layers PAS1 and PAS2 are not provided in at least a portion of the transmission area TA to form the first undercut structure UC1 in the transmission area TA. Each of the first and second passivation layers PAS1 and PAS2 can include a first opening area OA1 exposing the buffer layer BF. The first opening area OA1 of the first passivation layer PAS1 can at least partially overlap the first opening area OA1 of the second passivation layer PAS2. The first opening areas OA1 of the first and second passivation layers PAS1 and PAS2 can at least partially overlap the first opening area OA1 of the insulating inter-layer ILD (e.g., a trench around the touch sensor TS).

The first and second passivation layers PAS1 and PAS2 can include an inorganic layer, for example, a silicon oxide layer (SiOx), a silicon nitride layer (SiNx) or their multi-layer.

A separate metal layer can be provided between the first and second passivation layers PAS1 and PAS2. At least some of the pixel power line VDDL, the common power line VSSL, the reference line RL, the data lines DL, the touch lines TL, the touch bridge line TBL can be formed in the metal layer. For example, the pixel power line VDDL and the common power line VSSL can be formed between the first and second passivation layers PAS1 and PAS2. In this situation, each of the pixel power line VDDL and the common power line VSSL can be provided to overlap a portion of the plurality of touch lines TL. For example, the pixel power line VDDL can overlap some of the touch lines TL in order to save space and increase the size of the transmission area TA. The pixel power line VDDL can be provided to overlap with two of the first touch lines TL arranged between the circuit area CA1, CA2, CA3, and CA4 and the transmission area TA arranged on the left side of the circuit area CA1, CA2, CA3, and CA4. The common power line VSSL can be provided to overlap with two of the second touch lines TL arranged between the circuit area CA1, CA2, CA3, and CA4 and the transmission area TA arranged on the right side of the circuit area CA1, CA2, CA3, and CA4. In this way, many elements can be overlapped with each other in the vertical direction in order to make more space for enlarging the transmission area TA to improve the see-through capability of the device.

The metal layer can include a single layer or multiple layers formed of one of molybdenum Mo, aluminum Al, chromium Cr, gold Au, titanium Ti, nickel Ni, neodymium Nd, copper Cu, ITO, and IZO, or an alloy thereof. For example, the metal layer can be formed of an alloy of molybdenum Mo and titanium Ti or can be formed in a stack structure of an alloy of molybdenum Mo and titanium Ti and ITO.

A planarization layer PLN for planarizing the step difference caused by the driving transistor DTR and signal lines can be provided over the second passivation layer PAS2. The planarization layer PLN can be provided in the non-transmission area NTA and may not be provided in at least a portion of the transmission area TA. The planarization layer PLN can induce refraction of light being transmitted therethrough, to thereby suppress transparency. Therefore, the transparent display panel 110 according to one embodiment of the present disclosure can increase transparency by removing a portion of the planarization layer PLN in the transmission area TA (e.g., there can be fewer layers in the transmission area TA). Also, the stacked layers constituting the transmission area TA can have a total thickness that is much thinner than the stacked layers constituting the subpixel area (e.g., the non-transmission area NTA).

The planarization layer PLN may not overlap with the first opening area OA1 of the plurality of inorganic layers. The planarization layer PLN is provided over the plurality of inorganic layers provided in the non-transmission area NTA, and the entire lower surface of the planarization layer PLN can be in contact with the upper surface of the uppermost inorganic layer among the plurality of inorganic layers. For example, the planarization layer PLN can be provided over the insulating interlayer ILD, the first passivation layer PAS1, and the second passivation layer PAS2 provided in the non-transmission area NTA. The entire lower surface of the planarization layer PLN can be in contact with the upper surface of the second passivation layer PAS2. That is, a portion of the lower surface of the planarization layer PLN may not be exposed in the first opening area OA1 of the plurality of inorganic layers.

As shown in FIG. 9, the planarization layer PLN can be formed such that a portion of the lower surface thereof is exposed in the opening area of the plurality of inorganic layers. In this situation, the lower surface of the planarization layer PLN can be in contact with a filler 150 in the opening area of the plurality of inorganic layers. Herein, moisture H2O can be included in the filler 150, and the moisture H2O included in the filler 150 may permeate into the lower surface of the planarization layer PLN being in contact with the filler 150. Since the planarization layer PLN contacts the light emitting elements of the plurality of subpixels SP1, SP2, SP3, and SP4, the moisture H2O which permeates into the planarization layer PNL can be transferred to the light emitting elements. Accordingly, the light emitting elements may become degraded, and a fade-out phenomenon in which luminance is reduced can occur.

In the transparent display panel 110 according to one embodiment of the present disclosure, the planarization layer PLN is not overlapped with the first opening area OA1 of the insulating interlayer ILD, the first passivation layer PAS1, and the second passivation layer PAS2, so that it is possible to prevent the moisture H2O from penetrating into the planarization layer PLN, and furthermore, to prevent the moisture H2O included in the filler 150 from being transferred to the light emitting element.

The planarization layer PLN can include an organic film such as acryl resin, epoxy resin, phenolic resin, polyamide resin, or polyimide resin.

In the transparent display panel 110 according to one embodiment of the present disclosure, the first undercut structure UC1 can be formed by using an organic pattern OP and a plurality of inorganic insulating layers.

In detail, the first undercut structure UC1 can include a first organic pattern OP1 and a plurality of inorganic layers including a first opening area OA1. The first organic pattern OP1 can be provided on the same layer as the planarization over PLN and can be formed of the same material as the planarization layer PLN. The first organic pattern OP1 can be spaced apart from the planarization layer PLN provided in the non-transmission area NTA, but not limited thereto. The first organic pattern OP1 can be formed of a material different from that of the planarization layer PLN. The plurality of inorganic layers can include the first and second passivation layers PAS1 and PAS2 and the insulating interlayer ILD, but not limited thereto. The plurality of inorganic layers can further include another inorganic layer provided between the first substrate 111 and the planarization layer PLN.

The first organic pattern OP1 can be provided over a plurality of inorganic layers provided in an area overlapping the touch sensor TS. For example, the first organic pattern OP1 can have a dome shape or a tapered shape relative to the substrate, but embodiments are not limited thereto. Also, the first organic pattern OP1 can be formed as a type of wall, berm or barrier that extends all the way around the perimeter of the touch sensor TS. As shown in FIG. 7, the first opening area OA1 of the plurality of inorganic layers can have a closed shape in a plan view along the edge of the touch sensor TS. For example, the first opening area OA1 of the plurality of inorganic layers can have a rectangular shape in a plan view (e.g., a rectangular cut-out shape), but embodiments are not limited thereto. Accordingly, the plurality of inorganic layers provided in the area overlapping the touch sensor TS can be separated from the plurality of inorganic layers provided in the area overlapping the plurality of subpixels SP1, SP2, SP3, and SP4 with the first opening area OA1 interposed therebetween (e.g., a trench or rectangular cut-out portion).

The first organic pattern OP1 can be provided over the plurality of inorganic layers provided in the area overlapping the touch sensor TS, and can be spaced apart from the plurality of inorganic layers provided in the area overlapping the plurality of subpixels SP1, SP2, SP3, and SP4. The first organic pattern OP1 can be provided over a portion of the upper surface of the uppermost layer among the plurality of inorganic layers provided in the area overlapping the touch sensor TS. As shown in FIG. 7, the first organic pattern OP1 can be configured to have a first width W1 over the upper surface of the uppermost layer among the plurality of inorganic layers provided in the area overlapping the touch sensor TS. The first organic pattern OP1 can be formed along the edge of the touch sensor TS. The first organic pattern OP1 can be a ring pattern having a closed shape in a plan view. For example, the first organic pattern OP1 can be a ring pattern having a rectangular shape in a plan view (e.g., similar to a picture frame shape).

At least a portion of the first organic pattern OP1 can be overlapped with the first opening area OA1 of the plurality of inorganic layers (e.g., forming an eave portion, an overhang portion or a lip portion, etc.). The first undercut structure UC1 can include a first undercut UC11 formed in an area where the first organic pattern OP1 is overlapped with at least a portion of the first opening area OA1. According as the first organic pattern OP1 protrudes out more than the plurality of inorganic layers provided in the area overlapping the touch sensor TS in the first opening area OA1, the first undercut structure UC1 can form the first undercut UC11.

In the first undercut UC11, the first organic pattern OP1 can protrude out more than the plurality of inorganic layers provided in the area overlapping the touch sensor TS in the direction of the plurality of subpixels SP1, SP2, SP3, and SP4. Accordingly, the first undercut structure UC1 can expose at least a portion of the lower surface of the first organic pattern OP1 in the first opening area OA1, and a space from the buffer layer BF can be formed under the exposed lower surface of the first organic pattern OP1 without forming the plurality of inorganic layers. However, according to an alternative embodiment, the first organic pattern OP1 can be formed on the plurality of inorganic layers along an edge of non-transmission area NTA (e.g., on an edge of the subpixel side), rather than on the plurality of inorganic layers along an edge of transmission area TA (e.g., under an edge of the touch sensor TS). In this way, a total thickness of the stacked layers in transmission area TA can be made even thinner compared to the total thickness of the stacked layers in the subpixel area.

The first undercut structure UC1 can be provided in the transmission area TA. More specifically, the first undercut structure UC1 can be provided along the edge of the touch sensor TS or between the touch sensor TS and the non-transmission area NTA or along the along the edge of the subpixel area (e.g., NTA). For example, the first undercut structure UC1 can be formed along the edge of the transmission area TA. Also, the first undercut structure UC1 can have a closed shape in a plan view. For example, the first undercut structure UC1 can have a rectangular shape in a plan view.

In the transparent display panel 110 according to one embodiment of the present disclosure, since the first organic pattern OP1 and the plurality of inorganic layers can be made of the transparent material, it is possible to prevent light transmittance from being reduced by the first undercut structure UC1.

A light emitting element, which includes a first electrode layer 120, an organic light emitting layer 130 and a second electrode layer 140, and a bank 125 can be provided over the planarization layer PLN.

With reference to FIG. 9, the first electrode layer 120 can be provided over the planarization layer PLN for each of the subpixels SP1, SP2, SP3 and SP4. The first electrode layer 120 may not provided in the transmissive area TA. The first electrode layer 120 can be connected to the driving transistor DTR. In detail, the first electrode layer 120 can be connected to one of the source electrode SE and the drain electrode DE of the driving transistor DTR through a contact hole that passes through the planarization layer PLN and the first and second passivation layers PAS1 and PAS2.

The first electrode layer 120 can include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy can be an alloy of silver (Ag), palladium (Pd), copper (Cu), etc. The MoTi alloy can be an alloy of molybdenum (Mo) and titanium (Ti). The first electrode layer 120 can be an anode electrode.

The bank 125 can be provided over the planarization layer PLN. The bank 125 can be provided to at least partially cover an edge of the first electrode layer 120 and expose a portion of the first electrode layer 120. Therefore, the bank 125 can prevent a problem in which light emitting efficiency is deteriorated due to concentration of a current on an end of the first electrode layer 120.

The bank 125 can define light emission areas EA1, EA2, EA3 and EA4 of the subpixels SP1, SP2, SP3 and SP4. The light emission areas EA1, EA2, EA3 and EA4 of each of the subpixels SP1, SP2, SP3 and SP4 represent an area in which the first electrode layer 120, the organic light emitting layer 130 and the cathode electrode CE are sequentially stacked and holes from the first electrode layer 120 and electrons from the cathode electrode CE are combined with each other in the organic light emitting layer 130 to emit light. In this situation, the area in which the bank 125 is provided can become the non-light emission area NEA because light is not emitted therefrom, and the area in which the bank 125 is not provided and the first electrode is exposed can become the light emission area EA. The bank 125 can include an organic layer such as an acrylic resin, an epoxy resin, a phenolic resin, a polyamide resin, and a polyimide resin.

The organic light emitting layer 130 can be disposed over the first electrode layer 120. The organic light emitting layer 130 can include a hole transporting layer, a light emitting layer and an electron transporting layer. In this situation, when a voltage is applied to the first electrode layer 120 and the cathode electrode CE, holes and electrons move to the light emitting layer through the hole transporting layer and the electron transporting layer, respectively and are combined with each other in the light emitting layer to emit light.

In one embodiment, the organic light emitting layer 130 can be a common layer commonly provided in the subpixels SP1, SP2, SP3 and SP4. In this situation, the light emitting layer can be a white light emitting layer for emitting white light.

In another embodiment, the light emitting layer of the organic light emitting layer 130 can be separately provided for each of the subpixels SP1, SP2, SP3 and SP4. For example, a green light emitting layer for emitting green light can be provided in the first subpixel SP1, a red light emitting layer for emitting red light can be provided in the second subpixel SP2, a blue light emitting layer for emitting blue light can be provided in the third subpixel SP3, and a white light emitting layer for emitting white light can be provided in the fourth subpixel SP4. In this situation, the light emitting layer of the organic light emitting layer 130 is not provided in the transmissive area TA.

An organic light emitting layer 130 can be separated from the non-transmissive area NTA and the transmissive area TA by the first undercut structure UC1. In detail, the organic light emitting layer 130 can be separated from an organic light emitting layer 131 provided in the non-transmissive area NTA and an organic light emitting layer 132 provided in the transmissive area TA by the first undercut structure UC1. That is, the organic light emitting layer 131 provided in the non-transmissive area NTA and the organic light emitting layer 132 provided in the transmissive area TA can be spaced apart from each other by the first undercut structure UC1 (e.g., cut by trench portion).

A second electrode layer 140 can be disposed over the organic light emitting layer 130 and the bank 125. When the second electrode layer 140 is deposited on an entire surface, the second electrode layer 140 can be separated without being continuous between the non-transmissive area NTA and the transmissive area TA by the first undercut structure UC1. In detail, the second electrode layer 140 can be separated into a second electrode CE provided in the non-transmissive area NTA and a second electrode TSE provided in the transmissive area TA by the first undercut structure UC1.

The second electrode (hereinafter, referred to as a "cathode electrode") provided in the non-transmission area NTA can be a cathode electrode constituting the light emitting element. The cathode electrode CE can be connected to the cathode contact electrode CCT and can be supplied with power from the common power line VSSL. The cathode electrode CE can be a common layer commonly formed on the subpixels SP1, SP2, SP3, and SP4 to apply the same voltage.

In addition, another portion of the second electrode (hereinafter, referred to as a "touch sensor electrode") provided in the transmission area TA can be a touch sensor electrode and can constitute the touch sensor TS. The touch sensor electrode TSE can be formed over the first organic pattern OP1 and the second passivation layer PAS2 provided in the transmission area TA. The touch sensor electrode TSE can overlap at least a portion of the first opening area OA1 of the plurality of inorganic layers in the edge area. In other words, the touch sensor electrode and the display cathode of the light emitting element can be made during a same process, from a same material and at a same layer, but embodiments are not limited thereto. This can reduce manufacturing time and costs, while also producing a much thinner transparent touch display device.

The touch sensor electrode TSE can be connected to the touch contact electrode TCT and can be configured to provide a change in capacitance to the touch line TL. Specifically, the touch sensor TS can be connected to the touch line TL through the touch contact electrode TCT and the touch bridge line TBL.

The touch bridge line TBL can connect the touch contact electrode TCT to the touch line TL. As shown in FIG. 3, the touch bridge line TBL can include a first touch bridge line TBL1, a second touch bridge line TBL2, and a third touch bridge line TBL3.

The first touch bridge line TBL1 can be disposed in an area where the first non-transmission area NTA1 and the second non-transmission area NTA2 intersect, and can extend in the second direction (e.g., X-axis direction). One end of the first touch bridge line TBL1 can be connected to one of the second touch bridge line TBL2 through a second contact hole CH2. The other end of the first touch bridge line TBL1 can be connected to another of the second touch bridge line TBL2 through a third contact hole CH3. The first touch bridge line TBL1 can be connected to one of the plurality of touch lines TL through the first contact hole CH1.

The first touch bridge line TBL1 can be disposed in a layer different from the first signal lines SL1 extending in the first direction (e.g., Y-axis direction) in the first non-transmission area NTA1. The first touch bridge line TBL1 can be disposed on the same layer as at least one of a light shielding layer LS, and the active layer ACT, gate electrode GE, source electrode SE, and drain electrode DE of the driving transistor DTR. For example, the first touch bridge line TBL1 can be disposed on the same layer as the gate electrode GE of the driving transistor DTR.

The second touch bridge line TBL2 can be provided in the second non-transmission area NTA2 arranged between the transmission areas TA. The second touch bridge line TBL2 can be electrically connected to the first touch bridge line TBL1 and can extend in the second direction (e.g., X-axis direction). Specifically, one end of the second touch bridge line TBL2 can be connected to one of the first touch bridge line TBL1 through a second contact hole CH2. The other end can be connected to another of the first touch bridge line TBL1 through a third contact hole CH3.

The second touch bridge line TBL2 can be disposed on the same layer as at least one of the light shielding layer LS, and the active layer ACT, gate electrode GE, source electrode SE, and drain electrode DE of the driving transistor DTR. For example, the second touch bridge line TBL2 can be disposed on the same layer as the light shielding layer LS.

The third touch bridge line TBL3 can electrically connect the touch contact electrode TCT to the second touch bridge line TBL2. The third touch bridge line TBL3 can protrude from one side of the second touch bridge line TBL2 and extend to the area overlapping the touch sensor TS. The third touch bridge line TBL3 can be connected to the touch contact electrode TCT at its one end.

The third touch bridge line TBL3 can be formed in a layer provided between the first substrate 111 and the driving transistor DTR. According to one embodiment, the third touch bridge line TBL3 can be provided on the same layer as the light shielding layer LS and can be formed of the same material as the light shielding layer LS. The third touch bridge line TBL3 can extend across the first undercut structure UC1. The first undercut structure UC1 can be formed through wet etching processes. According to one embodiment of the present disclosure, the transparent display panel 110 can be formed on the same layer as the light shielding layer LS in order to prevent the third touch bridge line TBL3 from being lost in the wet etching processes for forming the first undercut structure UC1.

The third touch bridge line TBL3 can be formed on the same layer as the second touch bridge line TBL2, but not necessarily limited thereto. The third touch bridge line TBL3 can be formed in a layer different from the second touch bridge line TBL2. However, even in this situation, the third touch bridge line TBL3 is formed on a layer provided between the first substrate 111 and the driving transistor DTR, preferably.

The touch contact electrode TCT can be provided in the transmission area TA. The touch contact electrode TCT is disposed between the third touch bridge line TBL3 and the touch sensor electrode TSE, whereby the third touch bridge line TBL3 and the touch sensor electrode TSE are electrically connected to each other. The touch contact electrode TCT can be connected to the third touch bridge line TBL3 through a contact hole.

In addition, at least a portion of the upper surface of the touch contact electrode TCT is exposed by a second undercut structure. The touch sensor electrode TSE can be connected to the exposed upper surface of the touch contact electrode TCT. Specifically, the touch contact electrode TCT can be formed in a layer provided between the buffer layer BF and the second passivation layer PAS2. According to one embodiment, the touch contact electrode TCT can be provided between the insulating interlayer ILD and the first passivation layer PAS1. That is, the touch contact electrode TCT can be provided on the same layer as the source electrode SE and the drain electrode DE of the driving transistor DTR.

In this situation, the first and second passivation layers PAS1 and PAS2 can include an opening area exposing at least a portion of the upper surface of the touch contact electrode TCT. According as the touch sensor electrode TSE is connected to the exposed upper surface of the touch contact electrode TCT, the touch contact electrode TCT can be electrically connected to the touch sensor electrode TSE. As a result, the touch sensor electrode TSE can be electrically connected to the touch line TL through the touch contact electrode TCT and the touch bridge line TBL.

A second electrode layer 140 including the cathode electrode CE and the touch sensor electrode TSE can include a transparent conductive material TCO such as ITO and IZO, or a semi-transmissive conductive material such as magnesium Mg, silver Ag, or an alloy of magnesium Mg and silver Ag. When the second electrode layer 140 includes a semi-transmissive metal material, a light emission efficiency can be increased by a micro cavity.

An encapsulation layer can be provided over the light emitting elements and the touch sensors TS. The encapsulation layer can be provided over the cathode electrode CE and the touch sensor electrode TSE and can be configured to cover the cathode electrode CE and the touch sensor electrode TSE. The encapsulation layer prevents oxygen or moisture from penetrating into an organic light emitting layer 130, the cathode electrode CE, and the touch sensor electrode TSE. To this end, the encapsulation layer can include at least one inorganic layer and at least one organic film.

A color filter CF can be provided over one surface of the second substrate 112 that faces the first substrate 111. In this situation, the first substrate 111 having the light emitting elements and the touch sensors TS and the second substrate 112 having the color filter CF can be bonded to each other by the use of a filler 150. The filler 150 can include an organic material having an adhesive property, and for example, optically clear resin layer OCR.

The color filter CF can be patterned for each of the subpixels SP1, SP2, SP3 and SP4. A black matrix BM can be provided between color filters CF. The black matrix BM can be disposed between the subpixels SP1, SP2, SP3 and SP4 to prevent color mixing from occurring between adjacent subpixels SP1, SP2, SP3 and SP4. In addition, the black matrix BM can prevent light incident from the outside from being reflected by the plurality of lines, for example, the scan lines SCANL, the pixel power line VDDL, the common power line VSSL, the reference line RL, data lines DL, the touch bridge line TBL etc., provided between the subpixels SP1, SP2, SP3 and SP4.

In the transparent display panel 110 according to one embodiment of the present disclosure, the touch sensor electrode TSE of the touch sensor TS and the cathode electrode CE of the light emitting element can be formed on the same layer by the first undercut structure UC1. In the transparent display panel 110 according to one embodiment of the present disclosure, it is possible to simplify a touch process and it does not need to add a separate mask for the touch sensor electrode TSE. Accordingly, the transparent display panel 110 according to one embodiment of the present disclosure can realize a process optimization and can reduce a production energy. For example, the touch sensor electrode and the display cathode of the light emitting element can be made during a same process, from a same material and at a same layer. This can reduce manufacturing time and costs, while also producing a much thinner transparent touch display device with improved transparency.

In the transparent display panel 110 according to one embodiment of the present disclosure, since the plurality of inorganic layers and the first organic pattern OP1 can be made of the transparent material, it is possible to form the first undercut structure UC1 without a loss of light transmittance.

In the transparent display panel 110 according to one embodiment of the present disclosure, the planarization layer PLN provided in the non-transmission area NTA is not overlapped with the first opening area OA1 of the insulating interlayer ILD, the first passivation layer PAS1, and the second passivation layer PAS2. Accordingly, the transparent display panel 110 according to one embodiment of the present disclosure prevents moisture H2O from penetrating into the planarization layer PLN, and further prevents moisture H2O included in the filler 150 from being transferred to the light emitting element.

In addition, the touch lines TL are disposed under the light emitting element in the transparent display panel 110 according to one embodiment of the present disclosure so that it is possible to prevent the luminance efficiency of pixel P from being deteriorated or impaired by the touch lines TL.

In the transparent display panel 110 according to one embodiment of the present disclosure, the touch lines TL are disposed not to overlap with the circuit areas CA1, CA2, CA3, and CA4, thereby minimizing noise and the influence by the circuit element and improving the uniformity of parasitic capacitance.

Also, in the transparent display panel 110 according to one embodiment of the present disclosure, the plurality of touch lines TL can be provided in the first non-transmission area NTA1 and only one touch bridge line TBL for connecting the plurality of touch sensors TS can be provided in the second non-transmission area NTA2 so that it is possible to prevent the size of the transmission area TA from being reduced by the plurality of touch lines TL and the touch bridge line TBL and prevent any reduction of light transmittance.

FIGS. 7 and 8 illustrate that the transparent display panel 110 includes one undercut UC11, but embodiments are not limited thereto. According to another embodiment, the transparent display panel 110 can be provided with a plurality of undercuts. Hereinafter, embodiments in which the transparent display panel 110 includes the plurality of undercuts will be described in detail with reference to FIGS. 10 to 17.

Figure 10:
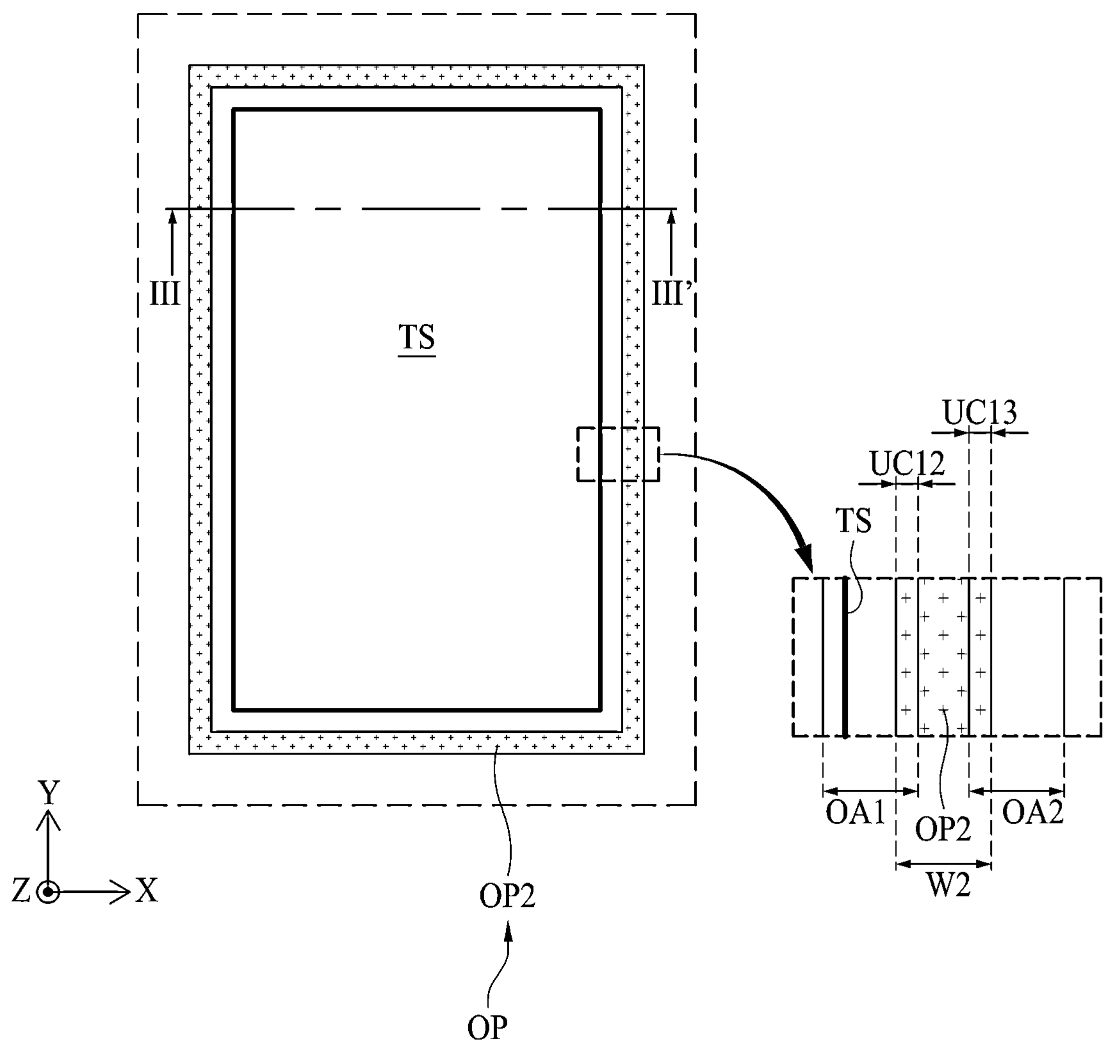
FIG. 10 is a plan view illustrating a touch sensor and a first undercut structure shown in FIG. 3 according to another embodiment of the present disclosure.
Figure 11:
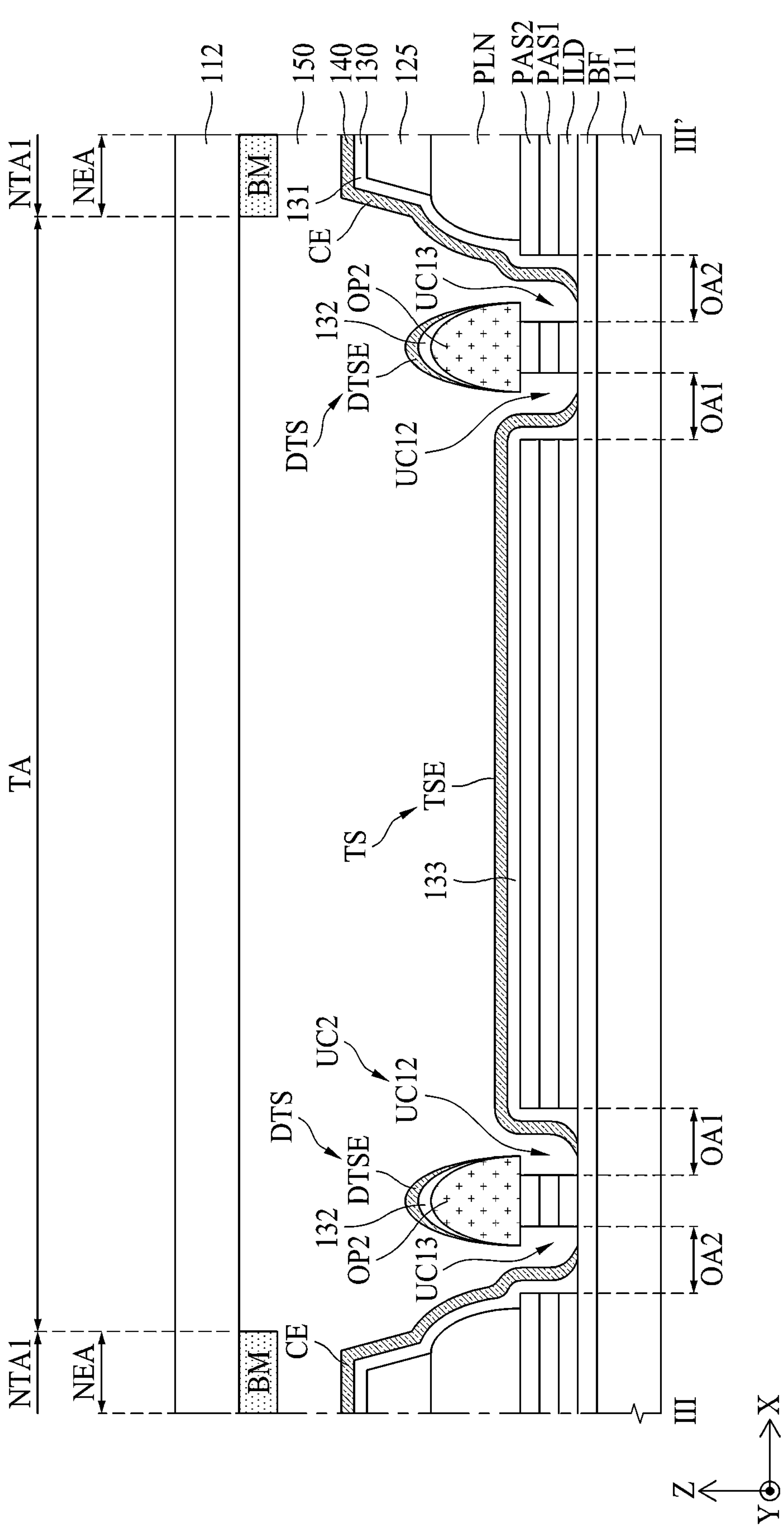
FIG. 11 is a cross sectional view illustrating an example along III-III' of FIG. 10 according to an embodiment of the present disclosure.
Figure 12:
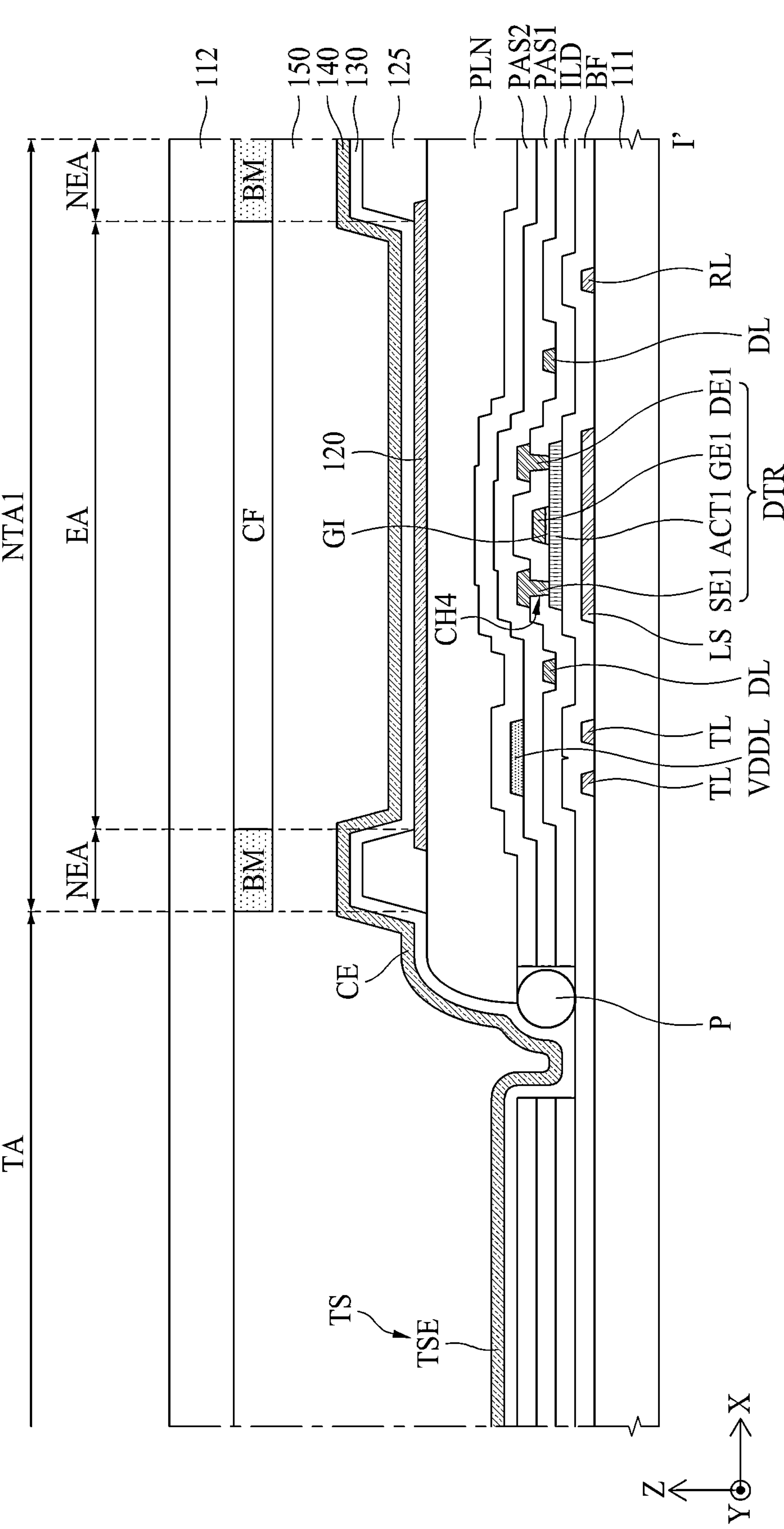
FIG. 12 illustrates an example in which foreign matter is inserted into an undercut structure according to an embodiment of the present disclosure.

FIG. 10 is a plan view illustrating a second embodiment of the touch sensor and the first undercut structure shown in FIG. 3, FIG. 11 is a cross sectional view illustrating an example along III-III' of FIG. 10, and FIG. 12 illustrates an example in which foreign matter is inserted into the undercut structure.

Except for the configuration of the undercut structure, a transparent display panel 110 shown in FIGS. 10 and 11 is substantially the same as the transparent display panel 110 shown in FIGS. 7 and 8. Hereinafter, differences will be mainly described, and a description of substantially the same configuration will be omitted.

Referring to FIGS. 10 and 11, the transparent display panel 110 according to the second embodiment of the present disclosure can include a second undercut structure UC2, in which two undercuts UC12 and UC13 are formed. To this end, the transparent display panel 110 according to the second embodiment of the present disclosure can be provided with a plurality of opening areas OA1 and OA2 in an insulating interlayer ILD, a first passivation layer PAS1, and a second passivation layer PAS2.

In order to form the second undercut structure UC2 in a transmission area TA, the insulating interlayer ILD may be not provided in at least a portion of the transmission area TA. The insulating interlayer ILD can include the plurality of opening areas OA1 and OA2 for exposing a buffer layer BF in the transmission area TA.

The insulating interlayer ILD is not provided in at least a portion of the transmission area TA, and then the first opening area OA1 and the second opening area OA2 for exposing the buffer layer BF can be formed. The first opening area OA1 of the insulating interlayer ILD is provided in the transmission area TA. At least a portion of the first opening area OA1 can overlap with an edge area of a touch sensor electrode TSE. The second opening area OA2 of the insulating interlayer ILD is provided between a non-transmission area NTA and the first opening area OA1, and at least a portion of the second opening area OA2 can overlap with an edge area of a cathode electrode CE in the subpixel area (e.g., NTA).

The first passivation layer PAS1 can be provided over the insulating interlayer ILD. In order to form the two undercuts UC12 and UC13 by the use of the second undercut structure UC2 in the transmission area TA, the first passivation layer PAS1 is not provided in at least a portion of the transmission area TA, and then the first opening area OA1 and the second opening area OA2 for exposing the buffer layer BF can be formed. The first opening area OA1 of the first passivation layer PAS1 can at least partially overlap with the first opening area OA1 of the insulating interlayer ILD, and the second opening area OA2 of the first passivation layer PAS1 can at least partially overlap with the second opening area OA2 of the insulating interlayer ILD.

The second passivation layer PAS2 can be provided over the first passivation layer PAS1. In order to form the two undercuts UC12 and UC13 by the use of the second undercut structure UC2 in the transmission area TA, the second passivation layer PAS2 is not provided in at least a portion of the transmission area TA, and then the first opening area OA1 and the second opening area OA2 for exposing the buffer layer BF can be formed. The first opening area OA1 of the second passivation layer PAS2 can at least partially overlap the first opening area OA1 of the first passivation layer PAS1 and the first opening area OA1 of the insulating interlayer ILD. The second opening area OA2 of the second passivation layer PAS2 can at least partially overlap the second opening area OA2 of the first passivation layer PAS1 and the second opening area OA2 of the insulating interlayer ILD.

A planarization layer PLN can be disposed over the second passivation layer PAS2. The planarization layer PLN can be provided in the non-transmission area NTA and may not be provided in at least a portion of the transmission area TA. The planarization layer PLN can induce refraction of light being transmitted therethrough, to thereby suppress transparency. Accordingly, the transparent display panel 110 according to the second embodiment of the present disclosure can increase transparency by removing a portion of the planarization layer PLN in the transmission area TA. For example, a total thickness and a total number of the stacked layers in the transmission area TA both can be less than a total thickness and a total number of the stacked layers in the non-transmission area NTA, which can improve transparency of the device and make it thinner, lighter and more compact.

The planarization layer PLN can be provided not to overlap with the opening areas of the plurality of inorganic layers, particularly, the second opening area OA2. The planarization layer PLN can be provided over the plurality of inorganic layers provided in the non-transmission area NTA. The entire lower surface of the planarization film PLN can be in contact with the upper surface of the uppermost inorganic layer among the plurality of inorganic layers. For example, the planarization layer PLN can be provided over the insulating interlayer ILD, the first passivation layer PAS1, and the second passivation over PAS2 provided in the non-transmission area NTA. The entire lower surface of the planarization layer PLN can be in contact with the upper surface of the second passivation layer PAS2. That is, a portion of the lower surface of the planarization layer PLN may not be exposed in the second opening area OA2 of the plurality of inorganic layers.

As shown in FIG. 12, the planarization layer PLN can be formed such that a portion of the lower surface thereof is exposed in the opening area of the plurality of inorganic layers. In this situation, the lower surface of the planarization layer PLN can be in contact with a filler 150 in the opening area of the plurality of inorganic layers. Herein, moisture H2O can be included in the filler 150, and the moisture H2O included in the filler 150 can permeate into the lower surface of the planarization layer PLN being in contact with the filler 150. Since the planarization layer PLN contacts light emitting elements of a plurality of subpixels SP1, SP2, SP3, and SP4, the moisture H2O which permeates into the planarization layer PNL can be transferred to the light emitting elements (e.g., via a wicking action). Accordingly, the light emitting elements can become degraded, and a fade-out phenomenon in which luminance is reduced can occur.

In the transparent display panel 110 according to the second embodiment of the present disclosure, the planarization layer PLN is not overlapped with the second opening area OA2 of the insulating interlayer ILD, the first passivation layer PAS1, and the second passivation layer PAS2, thereby preventing the moisture H2O from penetrating into the planarization layer PLN and preventing the moisture H2O included in the filler 150 from being transferred to the light emitting element.

In the transparent display panel 110 according to the second embodiment of the present disclosure, the second undercut structure UC2 can be formed by using an organic pattern OP and a plurality of inorganic insulating layers.

In detail, the second undercut structure UC2 can include a second organic pattern OP2 and a plurality of inorganic layers provided between a first opening area OA1 and a second opening area OA2. The second organic pattern OP2 can be provided on the same layer as the planarization layer PLN and can be formed of the same material as the planarization layer PLN. The second organic pattern OP2 can be spaced apart from the planarization layer PLN provided in the non-transmission area NTA, but not limited thereto. The second organic pattern OP2 can be formed of a material different from that of the planarization layer PLN. The plurality of inorganic layers can be the first and second passivation layers PAS1 and PAS2 and the insulating interlayer ILD, but not limited thereto. The plurality of inorganic layers can further include another inorganic layer provided between the first substrate 111 and the planarization layer PLN.

The second organic pattern OP2 can be provided over the plurality of inorganic layers provided between the first opening area OA1 and the second opening area OA2. As shown in FIG. 10, the first opening area OA1 of the plurality of inorganic layers can have a closed shape in a plan view along an edge of a touch sensor TS. For example, the first opening area OA1 of the plurality of inorganic layers can have a rectangular shape in a plan view, but not limited thereto. For example, the second organic pattern OP2 can have a rectangular ring shape in the form of a closed loop, in which the second organic pattern OP2 forms a type of wall or berm that extends along the outer perimeter of the touch sensor TS, but the second organic pattern OP2 is spaced apart from both of the plurality of inorganic layers in the subpixel area (e.g., non-transmission area NTA) and spaced apart form the plurality of inorganic layers in the touch sensor area (e.g., transmission area TA). The second organic pattern OP2 can have eave portions or overhangs on both sides, thus forming two undercut areas UC12 and UC13 (e.g., an inner undercut area and an outer undercut area).

Also, the second organic pattern OP2 can have a mushroom shape or a reverse tapered shape in the cross-section view. Also, the second organic pattern OP2 can have various shapes, such as a shape of an upside down trapezoid or an upside down triangle in the cross-section view. In this way, dual trenches can be formed around each touch sensor TS.

As shown in FIG. 10, the second opening area OA2 of the plurality of inorganic layers can be provided between the first opening area OA1 and the non-transmission area NTA. The second opening area OA2 of the plurality of inorganic layers can be spaced apart from the first opening area OA1 and can have a closed shape in a plan view along the outer edge of the first opening area OA1. For example, the second opening area OA2 of the plurality of inorganic layers can have a rectangular shape in a plan view, but not limited thereto.

Accordingly, the plurality of inorganic layers provided between the first opening area OA1 and the second opening area OA2 can be separated from the plurality of inorganic layers provided in an area overlapping the touch sensor TS with the first opening area OA1 interposed therebetween. In addition, the plurality of inorganic layers provided between the first opening area OA1 and the second opening area OA2 can be separated from the plurality of inorganic layers provided in an area overlapping the plurality of subpixels SP1, SP2, SP3, and SP4 with the second opening area OA2 interposed therebetween.

The second organic pattern OP2 can be provided over the plurality of inorganic layers provided between the first opening area OA1 and the second opening area OA2. The second organic pattern OP2 can be spaced apart from the plurality of inorganic layers provided in the area overlapping the plurality of subpixels SP1, SP2, SP3, and SP4 and the plurality of inorganic layers provided in the area overlapping the touch sensor TS. The second organic pattern OP2 can be provided over the entire upper surface of the uppermost layer among the plurality of inorganic layers provided between the first opening area OA1 and the second opening area OA2. As shown in FIGS. 10 and 11, the second organic pattern OP2 can have a second width W2 over the upper surface of the uppermost layer among the plurality of inorganic layers provided between the first opening area OA1 and the second opening area OA2. The second organic pattern OP2 can be formed along the outer area of the touch sensor TS. The second organic pattern OP2 can be a ring pattern having a closed shape in a plan view. For example, the second organic pattern OP2 can be a ring pattern having a rectangular shape in a plan view.

The second organic pattern OP2 can at least partially overlap the first opening area OA1 of the plurality of inorganic layers. The second undercut structure UC2 can include the second undercut UC12 formed in an area where the second organic pattern OP2 overlaps at least a portion of the first opening area OA1. According as the second organic pattern OP2 protrudes more than the plurality of inorganic layers provided between the first opening area OA1 and the second opening area OA2 in the first opening area OA1, the first undercut structure UC1 can form the second undercut UC12.

In the second undercut UC12, the second organic pattern OP2 can protrude more than the plurality of inorganic layers provided between the first opening area OA1 and the second opening area OA2 in the direction of the touch sensor TS. Accordingly, the second undercut structure UC2 exposes at least a portion of the lower surface of the second organic pattern OP2 in the first opening area OA1, and a space from the buffer layer BF can be provided under the exposed lower surface of the second organic pattern OP2 without forming the plurality of inorganic layers.

In addition, the second organic pattern OP2 can at least partially overlap with the second opening area OA2 of the plurality of inorganic layers. The second undercut structure UC2 can include the third undercut UC13 formed in an area where the second organic pattern OP2 overlaps at least a portion of the second opening area OA2. According as the second organic pattern OP2 protrudes more than the plurality of inorganic layers provided between the first opening area OA1 and the second opening area OA2 in the second opening area OA2 (e.g., the top of the second organic pattern OP2 has a taller height relative to the substrate than the top of the plurality of inorganic layers), the second undercut structure UC2 can form the third undercut UC13.

In the third undercut UC13, the second organic pattern OP2 can protrude more than the plurality of inorganic layers provided between the first opening area OA1 and the second opening area OA2 in the direction of the plurality of subpixels SP1, SP2, SP3, and SP4. Accordingly, the second undercut structure UC2 exposes at least a portion of the lower surface of the second organic pattern OP2 in the second opening area OA2, and a space from the buffer layer BF can be provided under the exposed lower surface of the second organic pattern OP2 without forming the plurality of inorganic layers.

The second undercut structure UC2 can be provided in the transmission area TA. More specifically, the second undercut structure UC2 can be provided along the edge area of the touch sensor TS or between the touch sensor TS and the non-transmission area NTA. For example, the second undercut structure UC2 can be formed along the edge area of the transmission area TA. Also, the second undercut structure UC2 can have a closed shape in a plan view. For example, the second undercut structure UC2 can have a rectangular shape in a plan view. For example, according to an embodiment, a plurality second organic patterns OP2 can be provided around a plurality of touch sensors TS forming a waffle type of shape, an egg crate shape or a lattice arrangement, but embodiments are not limited thereto.

In the transparent display panel 110 according to the second embodiment of the present disclosure, since the second organic pattern OP2 and the plurality of inorganic layers can be made of the transparent material, it is possible to prevent light transmittance from being reduced by the second undercut structure UC2.

A first electrode layer 120, an organic light emitting layer 130, a second electrode layer 140, and a bank 125 can be provided on the planarization layer PLN.

The first electrode layer 120 can be provided for each of the subpixels SP1, SP2, SP3, and SP4 on the planarization layer PLN. The first electrode layer 120 is not provided in the transmission area TA. The first electrode layer 120 can be connected to a driving transistor DTR. Specifically, the first electrode layer 120 can be connected to one of a source electrode SE and a drain electrode DE of the driving transistor DTR through a contact hole passing through the planarization layer PLN and the first and second passivation layers PAS1 and PAS2.

The organic light emitting layer 130 can be provided over the first electrode layer 120. The organic light emitting layer 130 is not continuous between the non-transmission area NTA and the transmission area TA due to the second undercut structure UC2. In detail, due to the second undercut structure UC2, the organic light emitting layer 130 can be separately divided into the organic light emitting layer 131 provided in the non-transmission area NTA, the organic light emitting layer 132 provided on the second organic pattern OP2 of the second undercut structure UC2, and the organic light emitting layer 133 provided in the transmission area TA. That is, due to the second undercut structure UC2, the organic light emitting layer 130 can be separately provided by the organic light emitting layer 131 provided in the non-transmission area NTA and the organic light emitting layer 133 provided in the transmission area TA.

The second electrode layer 140 can be provided over the organic light emitting layer 130 and a bank 125. When the second electrode layer 140 is deposited over the entire surface, the second electrode layer 140 is not continuous between the non-transmission area NTA and the transmission area TA by the second undercut structure UC2. Specifically, the second electrode layer 140 can be divided into a second electrode CE provided in the non-transmission area NTA, a second electrode DTSE provided over the second undercut structure UC2, and a second electrode TSE provided in the transmission area TA.

The second electrode CE (hereinafter, referred to as "cathode electrode") provided in the non-transmission area NTA can be the cathode electrode constituting the light emitting element. The cathode electrode CE is connected to the cathode contact electrode CCT and is configured to receive power from a common power line VSSL. The cathode electrode CE can be a common layer commonly formed on the subpixels SP1, SP2, SP3, and SP4 to apply the same voltage.

In addition, the second electrode TSE (hereinafter, referred to as "touch sensor electrode") provided in the transmission area TA can be the touch sensor electrode constituting the touch sensor TS. The touch sensor electrode TSE can be formed on the second passivation layer PAS2 provided in the transmission area TA. The touch sensor electrode TSE can overlap at least a portion of the first opening area OA1 of the plurality of inorganic layers in the edge area. The touch sensor electrode TSE is connected to the touch contact electrode TCT and is configured to provide a change in capacitance to the touch line TL.

The second electrode DTSE (hereinafter, referred to as "dummy touch sensor electrode") provided over the second undercut structure UC2 can be the dummy touch sensor electrode and can be configured to form a dummy touch sensor DTS. The dummy touch sensor electrode DTSE is not connected to the touch sensor TS and does not serve as the touch sensor TS. The dummy touch sensor electrode DTSE can be provided between the touch sensor TS and the light emitting element, and can more reliably separate the touch sensor electrode TSE of the touch sensor TS and the cathode electrode CE of the light emitting element from each other.

The second electrode layer 140 including the cathode electrode CE, the dummy touch sensor electrode DTSE, and the touch sensor electrode TSE can include a transparent conductive material TCO such as ITO, IZO, or a semi-transmissive conductive material such as magnesium Mg, silver Ag, or an alloy of magnesium Mg and silver Ag. When the second electrode layer 140 includes a semi-transmissive metal material, a light emission efficiency can be increased by a micro cavity.

In the transparent display panel 110 according to the second embodiment of the present disclosure, the touch sensor electrode TSE of the touch sensor TS and the cathode electrode CE of the light emitting element can be formed on the same layer by the second undercut structure UC2. In the transparent display panel 110 according to the second embodiment of the present disclosure, it is possible to simplify a touch process and it does not need to add a separate mask for the touch sensor electrode TSE. In other words, the second electrode layer 140 and the organic light emitting layer 130 can be laid down across the device and cut into different portions by the second organic pattern OP2, some of those cut portions can be used to form parts of the subpixels and others can be used to form parts of the touch sensors TS. Thus, parts of the touch sensors TS and parts the subpixels can be formed at the same time, at the same layer and from the same materials. Thus, reducing manufacturing time and costs, while also producing a thinner touch display device. Accordingly, the transparent display panel 110 according to the second embodiment of the present disclosure can realize a process optimization and can reduce a production energy.

In the transparent display panel 110 according to the second embodiment of the present disclosure, since the plurality of inorganic layers and the second organic pattern OP2 can be made of the transparent material, it is possible to form the second undercut structure UC2 without any loss or reduction of light transmittance.

In the transparent display panel 110 according to the second embodiment of the present disclosure, the planarization layer PLN provided in the non-transmission area NTA is not overlapped with the first and second opening areas OA1 and OA2 of the insulating interlayer ILD, the first passivation layer PAS1, and the second passivation layer PAS2. Accordingly, the transparent display panel 110 according to the second embodiment of the present disclosure prevents moisture H2O from penetrating into the planarization layer PLN, and further prevents moisture H2O included in the filler 150 from being transferred to the light emitting element.

Also, in the transparent display panel 110 according to the second embodiment of the present disclosure, the second organic pattern OP2 can be disposed while being spaced apart from the planarization layer PLN overlapped with the plurality of subpixels SP1, SP2, SP3, and SP4. Accordingly, even though the moisture H2O included in the filler 150 permeates into the second organic pattern OP2, the moisture H2O may not be transferred to the light emitting element.

In addition, the transparent display panel 110 according to the second embodiment of the present disclosure includes the second undercut UC12 and the third undercut UC13 in the second undercut structure UC2 so that it is possible to greatly reduce an occurrence of short circuit or current leakage from occurring between the cathode electrode CE for forming the light emitting element and the touch sensor electrode TSE for forming the touch sensor TS, since the cathode electrode CE for forming the light emitting element and the touch sensor electrode TSE for forming the touch sensor TS can be safely separated and disconnected from each other, even though they can be formed from the same layer.

As shown in FIG. 12, the planarization layer PLN is provided such that a portion of the lower surface thereof is exposed in the opening area of the plurality of inorganic layers, to thereby form the undercut structure. For the manufacturing process, foreign matter P can be inserted into the undercut structure. The second electrode layer 140 can be deposited on the undercut structure in which the foreign matter P is inserted. At this time, the cathode electrode CE for the light emitting element and the touch sensor electrode TSE for the touch sensor TS are undesirably connected to each other without being properly separated from each other, whereby the short circuit can occur. In this situation, a touch block including the touch sensor TS in which the short circuit to the cathode electrode CE occurs does not operate normally, whereby the light emitting elements do not operate normally.

In the transparent display panel 110 according to the second embodiment of the present disclosure, the plurality of undercuts UC12 and UC13 can be formed to securely separate the cathode electrode CE for forming the light emitting element and the touch sensor electrode TSE for forming the touch sensor TS from each other, as shown in FIGS. 10 and 11. In this situation, even though the foreign matter P is accidentally inserted into any parts of the second undercut UC12 and the third undercut UC13 during the manufacturing process, the short circuit may not occur between the cathode electrode CE for forming the light emitting element and the touch sensor electrode TSE for forming the touch sensor TS, since the touch sensor electrode TSE is securely separated from the cathode electrode CE of the light emitting element by the dual undercut configuration.

For example, the foreign matter P may be accidentally inserted into the third undercut U13. In this situation, the cathode electrode CE for forming the light emitting element can be connected without being separated from the dummy touch sensor electrode DTSE. The dummy touch sensor electrode DTSE is separated from the touch sensor electrode TSE by the second undercut UC12. Thus, even when the cathode electrode CE is electrically connected to the dummy touch sensor electrode DTSE at one side, the cathode electrode CE can still be electrically separated from the touch sensor electrode TSE, e.g., via the spacing on the other side.

As another example, foreign matter P may be accidentally inserted into the second undercut UC12. In this situation, the touch sensor electrode TSE for forming the touch sensor TS and the dummy touch sensor electrode DTSE can be connected to each other without being separated from each other. The dummy touch sensor electrode DTSE is separated from the cathode electrode CE by the third undercut UC13. Thus, even though the touch sensor electrode TSE is electrically connected to the dummy touch sensor electrode DTSE at one side, the touch sensor electrode TSE can remain electrically separated from the cathode electrode CE due to the spacing at the other side. Thus, providing redundancy, reducing defects and improving manufacturing yields.

As a result, the transparent display panel 110 according to the second embodiment of the present disclosure has the second undercut UC12 and the third undercut UC13 in the second undercut structure UC2, thereby significantly reducing a short circuit defect rate between the cathode electrode CE and the touch sensor electrode TSE.

In the transparent display panel 110 according to the second embodiment of the present disclosure, the dummy touch sensor electrode DTSE is provided between the touch sensor TS and the light emitting element, thereby preventing or minimizing the generation of parasitic capacitance between the touch sensor TS and components of the light emitting element, for example, between the first electrode layer 120 and the cathode electrode CE. That is, the dummy touch sensor electrode DTSE can serve as a blocking film for blocking the parasitic capacitance affecting the touch sensor TS.

In the transparent display panel 110 according to the second embodiment of the present disclosure, the parasitic capacitance affecting the touch sensor TS decreases, whereby it is possible to realize a high touch signal ratio compared to noise, improvising touch sensing accuracy, and overcoming a ghost touch defect. When a user touches the transparent display panel 110 with a finger and then releases the finger on the transparent display panel 110, an organic material of the transparent display panel 110 generates a temperature rise due to body temperature, whereby a dielectric constant is changed. Even though there is no actual touch on the transparent display panel 110, a value sensed from the touch sensor TS can be higher than a reference value of a touch and can be recognized as a touch due to the change in dielectric constant of the organic material, whereby the ghost touch defect or a lingering or lagging touch defect can occur. An occurrence probability of the ghost touch defect can be decreased or prevented accordingly as the total amount of parasitic capacitance affecting the touch sensor TS or the touch lines TL decreases. The transparent display panel 110 according to the second embodiment of the present disclosure can improve a touch recognition rate by decreasing the parasitic capacitance affecting the touch sensor TS.

Figure 13:
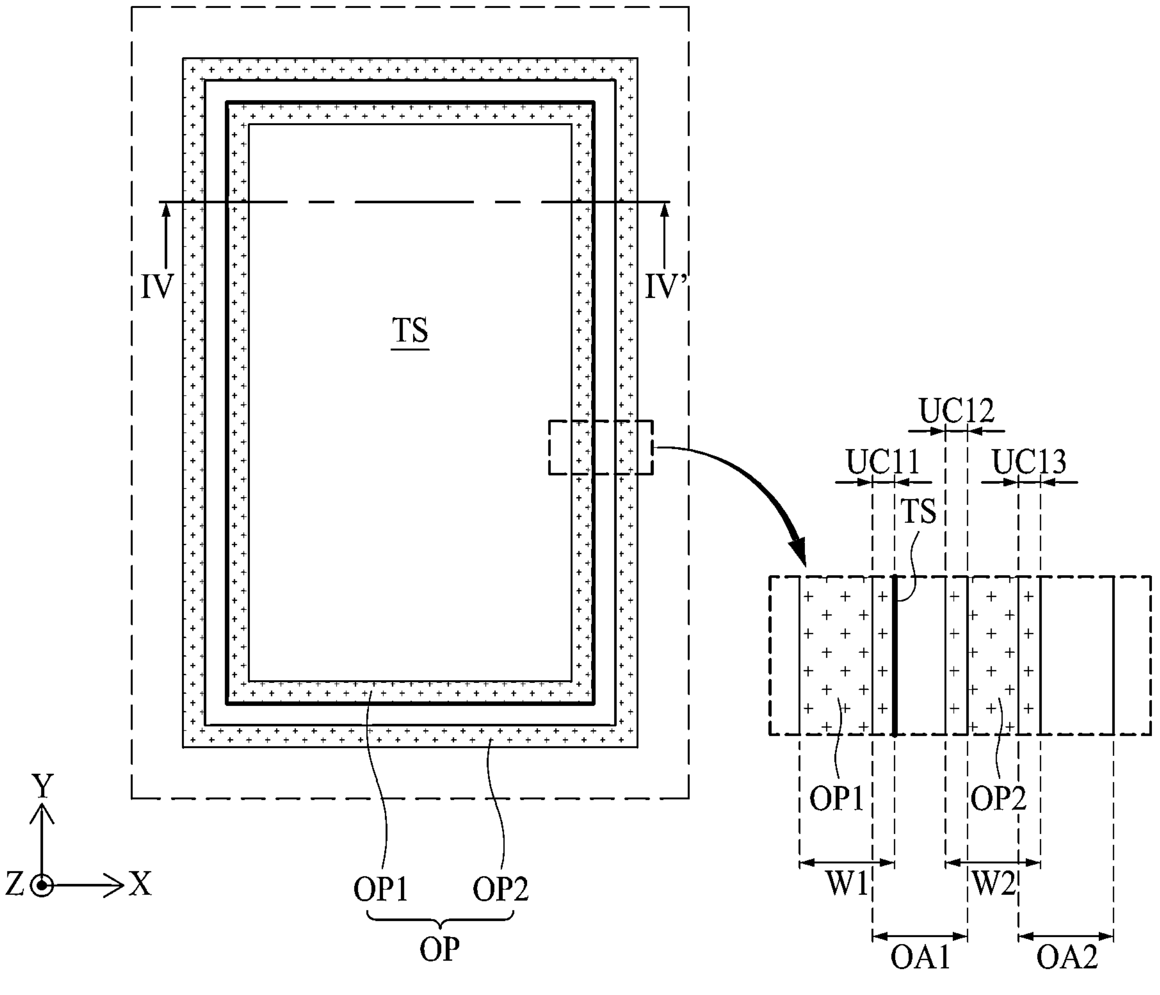
FIG. 13 is a plan view illustrating a touch sensor and an undercut structure shown in FIG. 3 according to another embodiment of the present disclosure.
Figure 14:
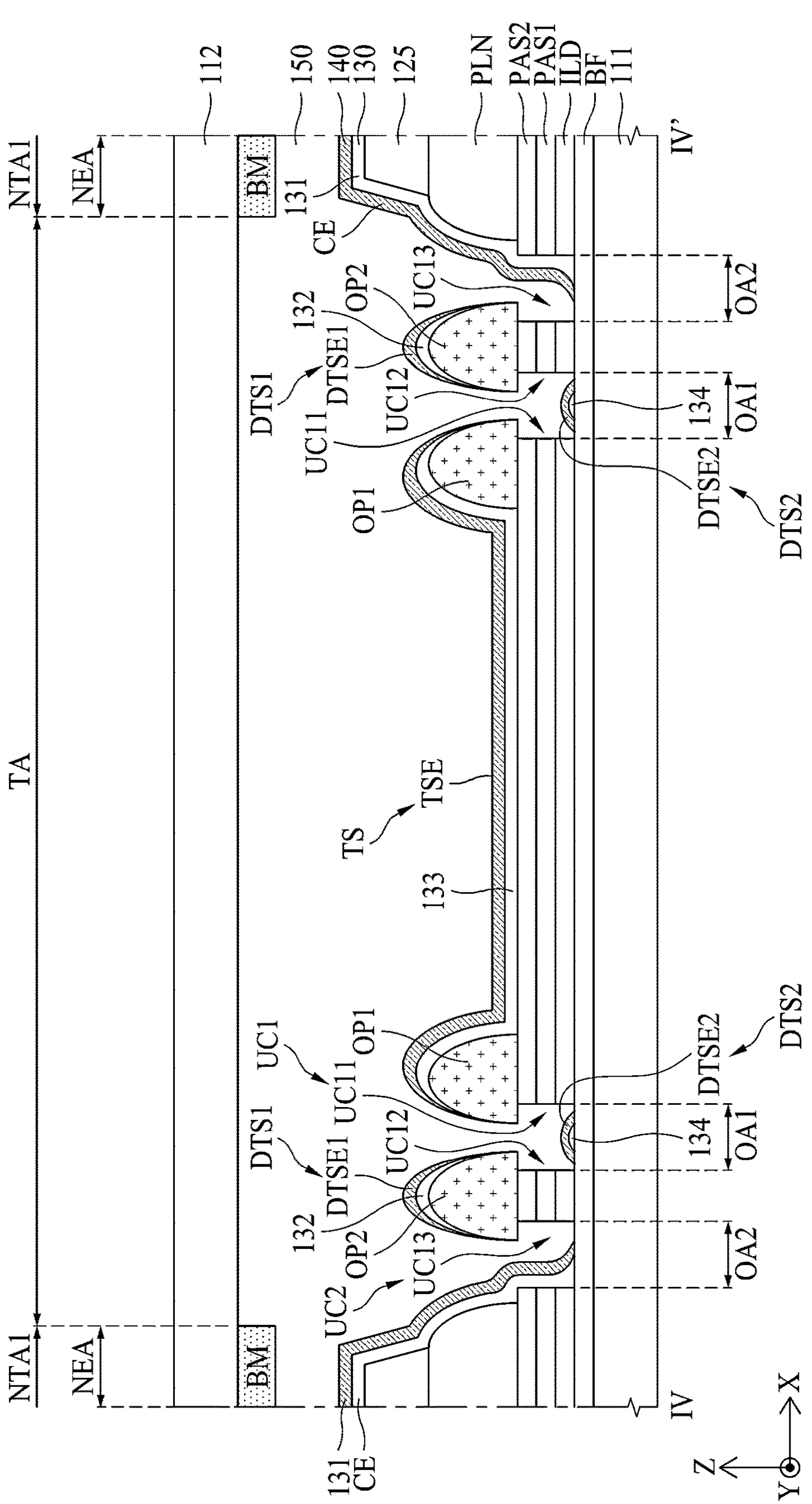
FIG. 14 is a cross sectional view illustrating an example along VI-VI' of FIG. 13 according to an embodiment of the present disclosure.
Figure 15:
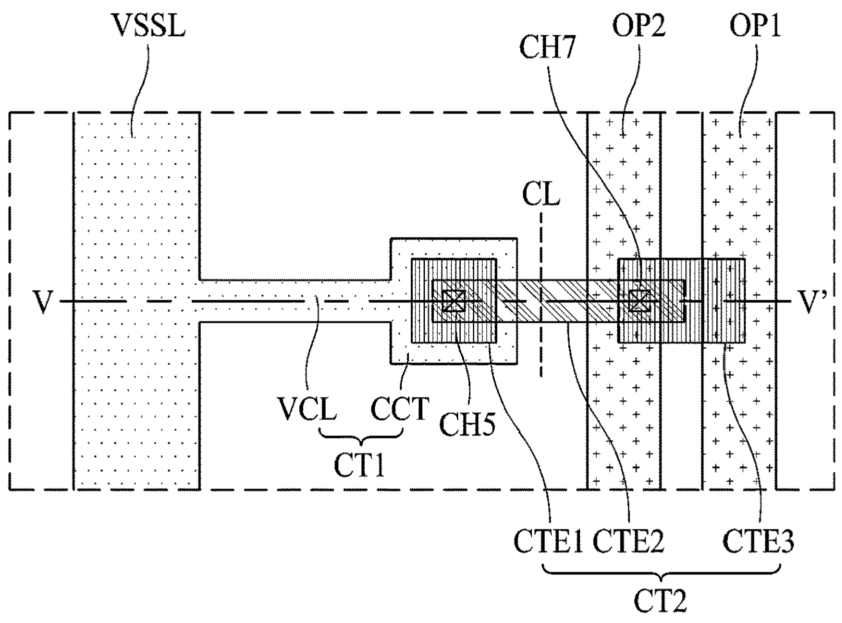
FIG. 15 is a plan view illustrating an example of connecting a dummy touch sensor electrode to a common power pixel line according to an embodiment of the present disclosure.
Figure 16:
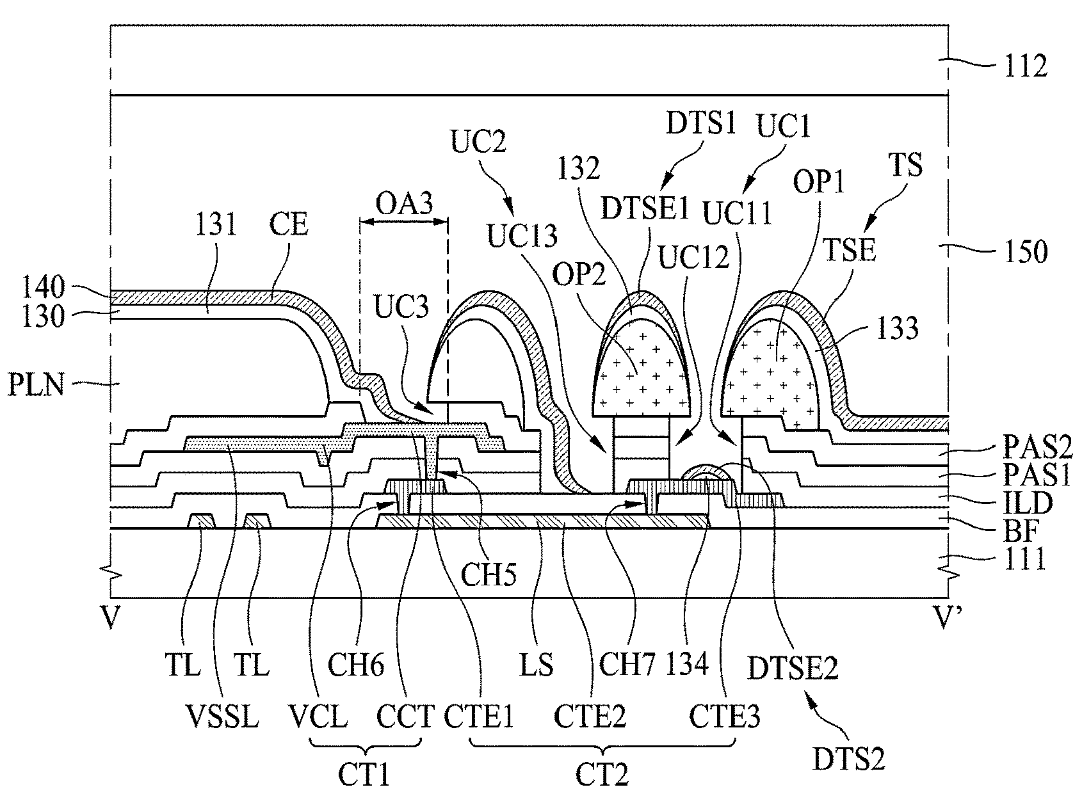
FIG. 16 is a cross sectional view illustrating an example along V-V' of FIG. 15 according to an embodiment of the present disclosure.

FIG. 13 is a plan view illustrating a third embodiment of the touch sensor and the undercut structure shown in FIG. 3, FIG. 14 is a cross sectional view illustrating an example along VI-VI' of FIG. 13, FIG. 15 is a plan view illustrating an example of connecting a dummy touch sensor electrode to a common power pixel line, and FIG. 16 is a cross sectional view illustrating an example along V-V' of FIG. 15.

Except for the undercut structure, a transparent display panel 110 shown in FIGS. 13 to 16 is substantially the same as the transparent display panel 110 shown in FIGS. 7 and 8. Hereinafter, differences will be mainly described, and a description of substantially the same configuration will be omitted. For example, a transparent display panel 110 shown in FIGS. 13 to 16 can have two rows or two rings of organic patterns OP.

Referring to FIGS. 13 and 14, the transparent display panel 110 according to the third embodiment of the present disclosure can include a first undercut structure UC1 for forming one undercut UC11 and a second undercut structure for forming two undercuts UC12 and UC13 (e.g., for at total of three different undercut areas). To this end, the transparent display panel 110 according to the third embodiment of the present disclosure can be provided with a plurality of opening areas OA1 and OA2 in an insulating interlayer ILD, a first passivation layer PAS1, and a second passivation layer PAS2.

In order to form the first undercut structure UC1 and the second undercut structure UC2 in a transmission area TA, the insulating interlayer ILD may be not provided in at least a portion of the transmission area TA. The insulating interlayer ILD can include the plurality of opening areas OA1 and OA2 for exposing a buffer layer BF in the transmission area TA.

The insulating interlayer ILD is not provided in at least a portion of the transmission area TA, and then the first opening area OA1 and the second opening area OA2 for exposing the buffer layer BF can be formed. The first opening area OA1 of the insulating interlayer ILD is provided in the transmission area TA. At least a portion of the first opening area OA1 can overlap an edge area of a touch sensor electrode TSE. The second opening area OA2 of the insulating interlayer ILD is provided between a non-transmission area NTA and the first opening area OA1, and at least a portion of the second opening area OA2 can overlap an edge area of a cathode electrode CE.

The first passivation layer PAS1 can be provided over the insulating interlayer ILD. In order to form the three undercuts UC11, UC12 and UC13 by the use of the first undercut structure UC1 and the second undercut structure UC2 in the transmission area TA, the first passivation layer PAS1 is not provided in at least a portion of the transmission area TA, and then the first opening area OA1 and the second opening area OA2 for exposing the buffer layer BF can be formed. The first opening area OA1 of the first passivation layer PAS1 can at least partially overlap the first opening area OA1 of the insulating interlayer ILD, and the second opening area OA2 of the first passivation layer PAS1 can at least partially overlap the second opening area OA2 of the insulating interlayer ILD.

The second passivation layer PAS2 can be provided over the first passivation layer PAS1. In order to form the three undercuts UC11, UC12 and UC13 by the use of the first undercut structure UC1 and the second undercut structure UC2 in the transmission area TA, the second passivation layer PAS2 is not provided in at least a portion of the transmission area TA, and then the first opening area OA1 and the second opening area OA2 for exposing the buffer layer BF can be formed. The first opening area OA1 of the second passivation layer PAS2 can at least partially overlap the first opening area OA1 of the first passivation layer PAS1 and the first opening area OA1 of the insulating interlayer ILD. The second opening area OA2 of the second passivation layer PAS2 can at least partially overlap with the second opening area OA2 of the first passivation layer PAS1 and the second opening area OA2 of the insulating interlayer ILD.

A planarization layer PLN can be disposed over the second passivation layer PAS2. The planarization layer PLN can be provided in the non-transmission area NTA and may not be provided in at least a portion of the transmission area TA. The planarization layer PLN can induce refraction of light being transmitted therethrough, to thereby suppress transparency. Accordingly, the transparent display panel 110 according to the third embodiment of the present disclosure can increase transparency by removing a portion of the planarization layer PLN in the transmission area TA. For example, the transmission area TA can have fewer layers and be thinner than the non-transmission area NTA.

The planarization layer PLN can be provided not to overlap WITH the opening areas of the plurality of inorganic layers, particularly, the second opening area OA2. The planarization layer PLN can be provided over the plurality of inorganic layers provided in the non-transmission area NTA. The entire lower surface of the planarization layer PLN can be in contact with the upper surface of the uppermost inorganic layer among the plurality of inorganic layers. For example, the planarization layer PLN can be provided over the insulating interlayer ILD, the first passivation layer PAS1, and the second passivation layer PAS2 provided in the non-transmission area NTA. The entire lower surface of the planarization layer PLN can be in contact with the upper surface of the second passivation layer PAS2. That is, a portion of the lower surface of the planarization layer PLN may not be exposed in the second opening area OA2 of the plurality of inorganic layers. For example, the outermost edge of the planarization layer PLN can be set further back than the outermost edge of the insulating layers (e.g., ILD, PAS1, PAS2) next to second opening area OA2 (e.g., see FIG. 14).

In the transparent display panel 110 according to the third embodiment of the present disclosure, the planarization layer PLN is not overlapped with the second opening area OA2 of the insulating interlayer ILD, the first passivation layer PAS1, and the second passivation layer PAS2, thereby preventing moisture H2O from penetrating into the planarization layer PLN and preventing the moisture H2O included in the filler 150 from being transferred to the light emitting element. For example, the edge of the planarization layer PLN is set farther back than the edges of the insulating interlayer ILD, the first passivation layer PAS1, and the second passivation layer PAS2 (e.g., a ledge portion can be formed on the upper edge of the second passivation layer PAS2 due to the setback distance of the planarization layer PLN).

In the transparent display panel 110 according to the third embodiment of the present disclosure, the first undercut structure UC1 and the second undercut structure UC2 can be formed by using an organic pattern OP and a plurality of inorganic insulating layers.

In detail, the first undercut structure UC1 can include a first organic pattern OP1 and a plurality of inorganic layers provided in the area overlapping the touch sensor TS. The second undercut structure UC2 can include a second organic pattern OP2 and a plurality of inorganic layers provided between the first opening area OA1 and the second opening area OA2. The first organic pattern OP1 and the second organic pattern OP2 can be provided on the same layer as the planarization layer PLN and can be formed of the same material as the planarization layer PLN. In this situation, the first organic pattern OP1 and the second organic pattern OP2 can be spaced apart from the planarization layer PLN provided in the non-transmission area NTA, but not limited thereto. The first organic pattern OP1 and the second organic pattern OP2 can be formed of a material different from that of the planarization layer PLN. The plurality of inorganic layers can be the first and second passivation layers PAS1 and PAS2 and the insulating interlayer ILD, but not limited thereto. The plurality of inorganic layers can further include another inorganic layer provided between the first substrate 111 and the planarization layer PLN. The first organic pattern OP1 and the second organic pattern OP2 can have a same shape or can have different shapes.

As shown in FIG. 13, the first opening area OA1 of the plurality of inorganic layers can have a closed ring shape in a plan view along an edge area of the touch sensor TS. For example, the first opening area OA1 of the plurality of inorganic layers can have a rectangular ring shape in a plan view, but embodiments are not limited thereto.

As shown in FIG. 13, the second opening area OA2 of the plurality of inorganic layers can be provided between the first opening area OA1 and the non-transmission area NTA. The second opening area OA2 of the plurality of inorganic layers can be spaced apart from the first opening area OA1 and can have a closed ring shape in a plan view along the outer edge of the first opening area OA1. For example, the second opening area OA2 of the plurality of inorganic layers can have a rectangular shape in a plan view, but not limited thereto. For example, the two organic patterns and the two opening areas can form a series of concentric walls and trenches around the touch sensor TS.

Accordingly, the plurality of inorganic layers provided between the first opening area OA1 and the second opening area OA2 can be separated from the plurality of inorganic layers provided in the area overlapping the touch sensor TS with the first opening area OA1 interposed therebetween. In other words, the second organic pattern OP2 and the corresponding inorganic layers underneath the second organic pattern OP2 can form a type of island shape and have a mushroom shape in the cross-section view. In addition, the plurality of inorganic layers provided between the first opening area OA1 and the second opening area OA2 can be separated from the plurality of inorganic layers provided in the area overlapping the plurality of subpixels SP1, SP2, SP3, and SP4 with the second opening area OA2 interposed therebetween.

The first organic pattern OP1 is provided over the plurality of inorganic layers provided in the area overlapping the touch sensor TS, and can be spaced apart from the plurality of inorganic layers provided between the first opening area OA1 and the second opening area OA2. The first organic pattern OP1 can be provided over a portion of the upper surface of the uppermost layer among the plurality of inorganic layers provided in the area overlapping the touch sensor TS. As shown in FIG. 13, the first organic pattern OP1 can have a first width W1 over the upper surface of the uppermost layer among the plurality of inorganic layers provided in the area overlapping the touch sensor TS. The first organic pattern OP1 can be formed along the edge area of the touch sensor TS. The first organic pattern OP1 can be a ring pattern having a closed shape in a plan view. For example, the first organic pattern OP1 can be a ring pattern having a rectangular shape in a plan view. For example, the two organic patterns and the two opening areas can form a series of concentric walls and trenches around the touch sensor TS.

The first organic pattern OP1 can at least partially overlap the first opening area OA1 of the plurality of inorganic layers. The first undercut structure UC1 can include the first undercut UC11 formed in an area where the first organic pattern OP1 overlaps at least a portion of the first opening area OA1. According as, the first organic pattern OP1 protrudes more than the plurality of inorganic layers provided in the area overlapping the touch sensor TS in the first opening area OA1, the first undercut structure UC1 can form the first undercut UC11 (e.g., due to the eave portion or overhang portion).

In the first undercut UC11, the first organic pattern OP1 can protrude more than the plurality of inorganic layers provided in the area overlapping the touch sensor TS in the direction of the plurality of subpixels SP1, SP2, SP3, and SP4. Accordingly, the first undercut structure UC1 exposes at least a portion of the lower surface of the first organic pattern OP1 in the first opening area OA1, and a space from the buffer layer BF can be formed under the exposed lower surface of the first organic pattern OP1 without forming the plurality of inorganic layers.

In addition, the second organic pattern OP2 can be spaced apart from the first organic pattern OP1. The second organic pattern OP2 is provided over the plurality of inorganic layers provided between the first opening area OA1 and the second opening area OA2. The second organic pattern OP2 can be spaced apart from the plurality of inorganic layers provided in the area overlapping the plurality of subpixels SP1, SP2, SP3, and SP4 and the plurality of inorganic layers provided in the area overlapping the touch sensor TS. The second organic pattern OP2 can be provided over the entire upper surface of the uppermost layer among the plurality of inorganic layers provided between the first opening area OA1 and the second opening area OA2. As shown in FIGS. 13 and 14, the second organic pattern OP2 can have a second width W2 over the upper surface of the uppermost layer among the plurality of inorganic layers provided between the first opening area OA1 and the second opening area OA2. The second width W2 can be equal to the first width W1. Alternatively, the second width W2 and the first width W1 can have different lengths. The second organic pattern OP2 can be formed along the outer area of the touch sensor TS. The second organic pattern OP2 can be a ring pattern having a closed loop shape in a plan view. For example, the second organic pattern OP2 can be a ring pattern having a rectangular shape in a plan view.

The second organic pattern OP2 can at least partially overlap with the first opening area OA1 of the plurality of inorganic layers. The second undercut structure UC2 can include the second undercut UC12 formed in an area where the second organic pattern OP2 overlaps at least a portion of the first opening area OA1. In the second undercut structure UC2, the second organic pattern OP2 protrudes more than the plurality of inorganic layers provided between the first opening area OA1 and the second opening area OA2 in the first opening area OA1, to thereby form the second undercut UC12.

In the second undercut UC12, the second organic pattern OP2 can protrude more than the plurality of inorganic layers provided between the first opening area OA1 and the second opening area OA2 in the direction of the touch sensor TS. Accordingly, the second undercut structure UC2 exposes at least a portion of the lower surface of the second organic pattern OP2 in the first opening area OA1, and a space from the buffer layer BF can be provided under the exposed lower surface of the second organic pattern OP2 without forming the plurality of inorganic layers.

In addition, the second organic pattern OP2 can at least partially overlap with the second opening area OA2 of the plurality of inorganic layers. The second undercut structure UC2 can include the third undercut UC13 formed in an area where the second organic pattern OP2 overlaps with at least a portion of the second opening area OA2. In the second undercut structure UC2, the second organic pattern OP2 protrudes more than the plurality of inorganic layers provided between the first opening area OA1 and the second opening area OA2 in the second opening area OA2, to thereby form the third undercut UC13 (e.g., due to the overhang portion).

In the third undercut UC13, the second organic pattern OP2 can protrude more than the plurality of inorganic layers provided between the first opening area OA1 and the second opening area OA2 in the direction of the plurality of subpixels SP1, SP2, SP3, and SP4. Accordingly, the second undercut structure UC2 exposes at least a portion of the lower surface of the second organic pattern OP2 in the second opening area OA2, and a space from the buffer layer BF can be provided under the exposed lower surface of the second organic pattern OP2 without forming the plurality of inorganic layers.

The first undercut structure UC1 and the second undercut structure UC2 can be provided in the transmission area TA. More specifically, the first undercut structure UC1 can be provided along the edge area of the touch sensor TS or between the touch sensor TS and the non-transmission area NTA. The second undercut structure UC2 can be provided along the outside of the touch sensor TS or between the first undercut structure UC1 and the non-transmission area NTA. For example, the first undercut structure UC1 can be formed along the edge area of the touch sensor TS. Also, the first undercut structure UC1 can have a closed shape in a plan view. For example, the first undercut structure UC1 can have a rectangular shape in a plan view. For example, the second undercut structure UC2 can be formed along the outside of the touch sensor TS between the first undercut structure UC1 and the non-transmission area NTA. Also, the second undercut structure UC2 can have a closed shape in a plan view. For example, the second undercut structure UC2 can have a rectangular shape in a plan view.

In the transparent display panel 110 according to the third embodiment of the present disclosure, since the first organic pattern OP1, the second organic pattern OP2, and the plurality of inorganic layers can be made of the transparent material, it is possible to prevent light transmittance from being reduced by the first undercut structure UC1 and the second undercut structure UC2.

A first electrode layer 120, an organic light emitting layer 130, a second electrode layer 140, and a bank 125 can be provided on the planarization layer PLN.

The first electrode layer 120 can be provided for each of the subpixels SP1, SP2, SP3, and SP4 on the planarization layer PLN. The first electrode layer 120 is not provided in the transmission area TA. The first electrode layer 120 can be connected to a driving transistor DTR. Specifically, the first electrode layer 120 can be connected to one of a source electrode SE and a drain electrode DE of the driving transistor DTR through a contact hole passing through the planarization layer PLN and the first and second passivation layers PAS1 and PAS2.

The organic light emitting layer 130 can be provided over the first electrode layer 120. The organic light emitting layer 130 is not continuous but is disconnected between the non-transmission area NTA and the transmission area TA due to the first undercut structure UC1 and the second undercut structure UC2. For example, the undercut structure UC1 and the second undercut structure UC2 can cut and divide the organic light emitting layer 130 into different portions. In detail, due to the first undercut structure UC1 and the second undercut structure UC2, the organic light emitting layer 130 can be separately divided into the organic light emitting layer 131 provided in the non-transmission area NTA, the organic light emitting layer 132 provided on the second organic pattern OP2 of the second undercut structure UC2, the organic light emitting layer 134 provided between the first organic pattern OP1 and the second organic pattern OP2, and the organic light emitting layer 133 provided in the transmission area TA. That is, due to the first undercut structure UC1 and the second undercut structure UC2, the organic light emitting layer 130 can be separately provided and divided into the organic light emitting layer 131 provided in the non-transmission area NTA and the organic light emitting layer 133 provided in the transmission area TA, which are separated and disconnected from each other.

The second electrode layer 140 can be provided over the organic light emitting layer 130 and the bank 125. When the second electrode layer 140 is deposited over the entire surface, the second electrode layer 140 is not continuous and is disconnected between the non-transmission area NTA and the transmission area TA by the first undercut structure UC1 and the second undercut structure UC2. Specifically, the second electrode layer 140 can be divided into a second electrode CE provided in the non-transmission area NTA, a second electrode DTSE1 provided over the second organic pattern OP2 of the second undercut structure UC2, a second electrode DTSE2 provided between the first organic pattern OP1 of the first undercut structure UC1 and the second organic pattern OP2 of the second undercut structure UC2, and a second electrode TSE provided in the transmission area TA.

The second electrode CE (hereinafter, referred to as "cathode electrode") provided in the non-transmission area NTA can be the cathode electrode constituting the light emitting element. The cathode electrode CE is connected to the cathode contact electrode CCT and is configured to receive power from a common power line VSSL. The cathode electrode CE can be a common layer commonly formed on the subpixels SP1, SP2, SP3, and SP4 to apply the same voltage.

In addition, the second electrode TSE (hereinafter, referred to as "touch sensor electrode") provided in the transmission area TA can be the touch sensor electrode constituting the touch sensor TS. The touch sensor electrode TSE can be formed on the second passivation layer PAS2 provided in the transmission area TA. The touch sensor electrode TSE can overlap with at least a portion of the first opening area OA1 of the plurality of inorganic layers in the edge area. The touch sensor electrode TSE is connected to the touch contact electrode TCT and is configured to provide a change in capacitance to the touch line TL.

The second electrode DTSE1 (hereinafter, referred to as "first dummy touch sensor electrode") provided over the second organic pattern OP2 of the second undercut structure UC2 can be the first dummy touch sensor electrode and can be configured to form a first dummy touch sensor DTS1. The first dummy touch sensor electrode DTSE1 is not connected to the touch sensor TS and does not serve as the touch sensor TS. For example, the first dummy touch sensor electrode DTSE1 is floated and can be referred to as a floating electrode.

The second electrode DTSE2 (hereinafter, referred to as "second dummy touch sensor electrode") provided between the first organic pattern OP1 of the first undercut structure UC1 and the second organic pattern OP2 of the second undercut structure UC2 can be the second dummy touch sensor electrode and can be configured to form a second dummy touch sensor DTS2. The second dummy touch sensor electrode DTSE2 is not connected to the touch sensor TS and does not serve as the touch sensor TS. The first and second dummy touch sensor electrodes DTSE1 and DTSE2 can be provided between the touch sensor TS and the light emitting element, and can more reliably separate the touch sensor electrode TSE of the touch sensor TS and the cathode electrode CE of the light emitting element from each other, thus better preventing any short circuits.

The second electrode layer 140 including the cathode electrode CE, the first and second dummy touch sensor electrodes DTSE1 and DTSE2, and the touch sensor electrode TSE can include a transparent conductive material TCO such as ITO, IZO, or a semi-transmissive conductive material such as magnesium Mg, silver Ag, or an alloy of magnesium Mg and silver Ag. When the second electrode layer 140 include a semi-transmissive metal material, a light emission efficiency can be increased by a micro cavity.

In the transparent display panel 110 according to the third embodiment of the present disclosure, the touch sensor electrode TSE of the touch sensor TS and the cathode electrode CE of the light emitting element can be formed on the same layer by the first undercut structure UC1 and the second undercut structure UC2. In the transparent display panel 110 according to the third embodiment of the present disclosure, it is possible to simplify a touch process and it does not need to add a separate mask for the touch sensor electrode TSE. Accordingly, the transparent display panel 110 according to the third embodiment of the present disclosure can realize a process optimization and can reduce a production energy.

In the transparent display panel 110 according to the third embodiment of the present disclosure, the touch sensor electrode TSE of the touch sensor TS and the cathode electrode CE of the light emitting element can be formed on the same layer by the first undercut structure UC1 and the second undercut structure UC2. In the transparent display panel 110 according to the third embodiment of the present disclosure, it is possible to simplify a touch process and it does not need to add a separate mask for the touch sensor electrode TSE. Accordingly, the transparent display panel 110 according to the third embodiment of the present disclosure can realize a process optimization and can reduce a production energy.

In the transparent display panel 110 according to the third embodiment of the present disclosure, since the first organic pattern OP1, the second organic pattern OP2, and the plurality of inorganic layers can be made of the transparent material, it is possible to form the first undercut structure UC1 and the second undercut structure UC2 without loss of light transmittance.

In the transparent display panel 110 according to the third embodiment of the present disclosure, the planarization layer PLN provided in the non-transmission area NTA is not overlapped with the first and second opening areas OA1 and OA2 of the insulating interlayer ILD, the first passivation layer PAS1, and the second passivation layer PAS2 (e.g., outer edge of the planarization layer PLN has a setback distance). Accordingly, the transparent display panel 110 according to the third embodiment of the present disclosure prevents moisture H2O from penetrating into the planarization layer PLN, and further prevents moisture H2O included in the filler 150 from being transferred to the light emitting element.

Also, in the transparent display panel 110 according to the third embodiment of the present disclosure, the first organic pattern OP1 and the second organic pattern OP2 can be spaced apart from the planarization layer PLN provided to overlap with the plurality of subpixels SP1, SP2, SP3, and SP4. Accordingly, even if the moisture included in the filler 150 penetrates into the first organic pattern OP1 or the second organic pattern OP2, the moisture may not be transmitted to the light emitting element.

In addition, the transparent display panel 110 according to the third embodiment of the present disclosure includes the first undercut UC11, the second undercut UC12, and the third undercut UC13, thereby greatly reducing the occurrence of a short circuit or current leakage between the cathode electrode CE for forming the light emitting element and the touch sensor electrode TSE for forming the touch sensor TS. As compared to the transparent display panel 110 according to the second embodiment of the present disclosure, the transparent display panel 110 according to the third embodiment of the present disclosure is provided with the increased number of undercuts, whereby an occurrence probability of a short circuit between the cathode electrode CE for forming the light emitting element and the touch sensor electrode TSE for forming the touch sensor TS can be further reduced.

In addition, the transparent display panel 110 according to the third embodiment of the present disclosure includes the first and second dummy touch sensor electrodes DTSE1 and DTSE2 between the touch sensor TS and the light emitting element, thereby preventing or minimizing the generation of parasitic capacitance between the touch sensor TS and components of the light emitting element and reducing noise, for example, between the first electrode layer 120 and the cathode electrode CE. That is, the first and second dummy touch sensor electrodes DTSE1 and DTSE2 can serve as a blocking film for blocking the parasitic capacitance which affects the touch sensor TS As compared to the transparent display panel 110 according to the second embodiment of the present disclosure, the transparent display panel 110 according to the third embodiment of the present disclosure is provided with the increased number of dummy touch sensor electrodes DTSE so that it is possible to reduce the parasitic capacitance by effectively blocking the parasitic capacitance affecting the touch sensor TS, which improves touch sensing accuracy.

In addition, the transparent display panel 110 according to the third embodiment of the present disclosure greatly reduces the parasitic capacitance affecting the touch sensor TS, thereby greatly improving a touch signal ratio to noise and further preventing a ghost touch defect. Accordingly, the transparent display panel 110 according to the third embodiment of the present disclosure can further improve a touch recognition rate.

Meanwhile, in the transparent display panel 110 according to the third embodiment of the present disclosure, the second dummy touch sensor electrode DTSE2 can be connected to the common power line VSSL. Specifically, the transparent display panel 110 according to the third embodiment of the present disclosure can include a common power line VSSL, a first power connection portion CT1, and a second power connection portion CT2, as shown in FIGS. 15 and 16.

The common power line VSSL can extend in a first direction (e.g., Y-axis direction) in a first non-transmission area NTA1. The common power line VSSL can supply cathode power to the cathode electrode CE of the subpixels SP1, SP2, SP3, and SP4 provided in the display area DA. The cathode power source can be a common power source commonly supplied to the subpixels SP1, SP2, SP3, and SP4.

The first power connection portion CT1 can electrically connect the common power line VSSL and the cathode electrode CE for forming the light emitting element. The first power connection portion CT1 can be provided between the common power line VSSL and the third undercut UC13 of the second undercut structure UC2. The first power connection portion CT1 can include a power connection line VCL and a cathode contact electrode CCT.

One end of the power connection line VCL is connected to the common power line VSSL, and the other end of the power connection line VCL is connected to the cathode contact electrode CCT. The cathode contact electrode CCT can be provided between the common power line VSSL and the third undercut UC13 of the second undercut structure UC2. According to one embodiment of the present disclosure, the common power line VSSL, the power connection line VCL, and the cathode contact electrode CCT can be integrally formed in one layer, as shown in FIGS. 15 and 16. According to another embodiment of the present disclosure, the common power line VSSL, the power connection line VCL, and the cathode contact electrode CCT can be provided on different layers while being electrically connected through a contact hole.

According to one embodiment, the common power line VSSL, the power connection line VCL, and the cathode contact electrode CCT can be provided between the first passivation layer PAS1 and the second passivation layer PAS2. The cathode contact electrode CCT can contact the cathode electrode CE by using a third undercut structure UC3. More specifically, a portion of the upper surface of the cathode contact electrode CCT can be exposed in a third opening area OA3 provided in the second passivation layer PAS2. Also, the planarization layer PLN may not be provided over at least a portion of the upper surface of the cathode contact electrode CCT exposed by the third opening area OA3, and can be formed to at least partially overlap with at least a portion of the third opening area OA3. The third undercut structure UC3 can include an undercut configured to expose at least a portion of the upper surface of the cathode contact electrode CCT by the planarization layer PLN and configured to overlap the third opening area OA3. The cathode contact electrode CCT can be in contact with the cathode electrode CE on the upper surface exposed by the second undercut structure UC2.

The second power connection portion CT2 can electrically connect the first power connection part CT1 and the second dummy touch sensor electrode DTSE2 of the second dummy touch sensor DTS2. The second power connection portion CT2 can electrically connect the cathode contact electrode CCT of the first power connection portion CT1 and the second dummy touch sensor electrode DTSE2 of the second dummy touch sensor DTS2 by using the plurality of electrodes.

Specifically, the second power connection portion CT2 can include a first power connection electrode CTE1, a second power connection electrode CTE2, and a third power connection electrode CTE3. The first power connection electrode CTE1 can be electrically connected to the cathode contact electrode CCT through a fifth contact hole CH5. According to one embodiment, the first power connection electrode CTE1 can be provided on the same layer as the gate electrode GE of the driving transistor DTR.

The second power connection electrode CTE2 can be electrically connected to the first power connection electrode CTE1 through a sixth contact hole CH6 at one end thereof. The second power connection electrode CTE2 can extend across the third undercut UC13 of the second undercut structure UC2 and can be electrically connected to the third power connection electrode CTE3 through a seventh contact hole CH 7 at the other end thereof.

According to one embodiment, the second power connection electrode CTE2 can be provided on the same layer as the light shielding layer LS. Thus, the second power connection electrode CTE2 is covered by the buffer layer BF under the third undercut UC13 of the second undercut structure UC2, and the upper surface of the second power connection electrode CTE2 may not be exposed.

One end of the third power connection electrode CTE3 can be provided under the plurality of inorganic layers provided between the first opening area OA1 and the second opening area OA2 and can be electrically connected to the second power connection electrode CTE2 through the seventh contact hole CH7. The third power connection electrode CTE3 can extend across the second undercut UC12 of the second undercut structure UC2 and the first undercut U11 of the first undercut structure UC1. The other end of the third power connection electrode CTE3 can be provided under the plurality of inorganic layers provided in the area overlapping the touch sensor TS.

According to one embodiment, the third power connection electrode CTE3 can be provided on the same layer as the gate electrode GE of the driving transistor DTR. Thus, the upper surface of the third power connection electrode CTE3 can be exposed in the second undercut UC12 and the first undercut UC11. The second dummy touch sensor electrode DTSE2 is provided to be in contact with the exposed upper surface of the third power connection electrode CTE3, whereby the second dummy touch sensor electrode DTSE2 can be electrically connected to the third power connection electrode CTE3. As a result, the second dummy touch sensor electrode DTSE2 can be electrically connected to the common power line VSSL through the first power connection portion CT1 and the second power connection portion CT2.

Accordingly, in the transparent display panel 110 according to the third embodiment of the present disclosure, cathode power is applied to the second dummy touch sensor electrode DTSE2. Since a constant voltage is applied to the second dummy touch sensor electrode DTSE2 in the transparent display panel 110 according to the third embodiment of the present disclosure, parasitic capacitance generated between the second dummy touch sensor electrode DTSE2 and the touch sensor electrode TSE can be predicted, thereby facilitating a touch control. In addition, the transparent display panel 110 according to the third embodiment of the present disclosure can reduce touch driving noise and improve touch sensing accuracy.

When the second dummy touch sensor electrode DTSE2 is in a floating state, the voltage of the second dummy touch sensor electrode DTSE2 can be changed due to the peripheral signal lines, the circuit elements, and the light emitting elements, whereby it might be impossible to predict the changed voltage. In this situation, it is difficult to predict the parasitic capacitance generated between the second dummy touch sensor electrode DTSE2 and the touch sensor electrode TSE. Furthermore, the touch driving control may not be facilitated.

Therefore, in the transparent display panel 110 according to the third embodiment of the present disclosure, the second dummy touch sensor electrode DTSE2 is electrically connected to the common power line VSSL, thereby preventing the parasitic capacitance between the second dummy touch sensor electrode DTSE2 and the touch sensor electrode TSE and enabling the stable touch control. In other words, the second dummy touch sensor electrode DTSE2 can be set to a predetermined voltage level via the common power line VSSL.

Meanwhile, when foreign matter is inserted into any one of the first undercut UC11 and the second undercut UC12 in the transparent display panel 110 according to the third embodiment of the present disclosure, the second power connection electrode CTE2 can be laser-cut along a cutting line CL. When the foreign matter is inserted into one of the first undercut UC11 and the second undercut UC12, the second dummy touch sensor electrode DTSE2 can be connected to the touch sensor electrode TSE of the touch sensor TS without being separated from the touch sensor electrode TSE of the touch sensor TS. In this situation, the second dummy touch sensor electrode DTSE2 can be electrically connected to the touch sensor electrode TSE of the touch sensor TS. The second dummy touch sensor electrode DTSE 2 is electrically connected to the common power line VSSL and the cathode electrode CE through the first power connection portion CT1 and the second power connection portion CT2. As a result, a short occurs between the cathode electrode CE and the touch sensor electrode TSE.

Accordingly, when the second dummy touch sensor electrode DTSE2 is electrically connected to the touch sensor electrode TSE in the transparent display panel 110 according to the third embodiment of the present disclosure, one of the components of the second power connection portion CT2, for example, the second power connection electrode CTE2 can be laser-cut along a cutting line CL. Accordingly, it is possible to prevent a short circuit between the cathode electrode CE and the touch sensor electrode TSE through the second dummy touch sensor electrode DTSE2 in the transparent display panel 110 according to the third embodiment of the present disclosure.

Figure 17:
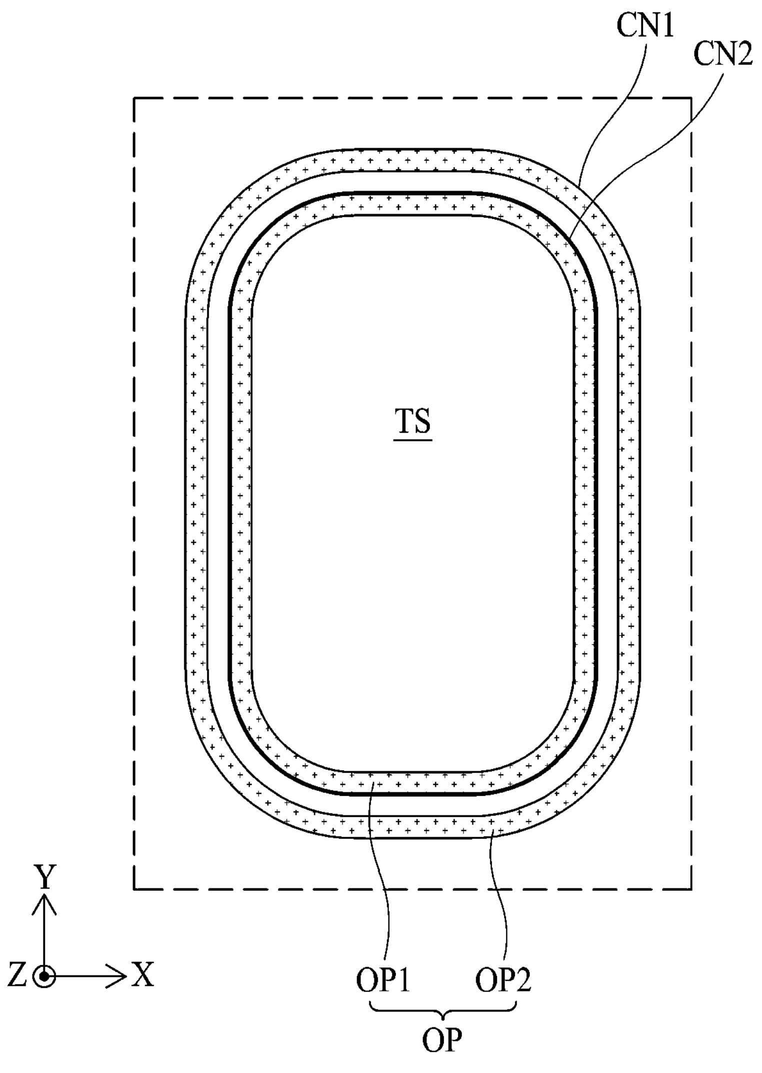
FIG. 17 is a plan view illustrating a touch sensor and an undercut structure shown in FIG. 3 according to another embodiment of the present disclosure.

FIG. 17 is a plan view illustrating a fourth embodiment of the touch sensor and the first undercut structure shown in FIG. 3.

The transparent display panel 110 according to various embodiments described above has a first undercut structure UC1 and the second undercut structure UC2 having a rectangular shape with right-angled corners in a plane view, but not limited thereto.

As shown in FIG. 17, in the transparent display panel 110 according to the fourth embodiment of the present disclosure, the first undercut structure UC1 and the second undercut structure UC2 can have a rectangular shape with rounded corners in a plan view. Accordingly, a first organic pattern OP1 for forming the first undercut structure UC1 can have a rectangular shape with a rounded corner CN1 in a plan view. A second organic pattern OP2 for forming the second undercut structure UC2 can have a rectangular shape with a rounded corner CN2. A first opening area OA1 and a second opening area OA2 formed in a plurality of inorganic layers can have a rectangular shape with rounded corners, in the same manner as the first and second organic patterns OP1 and OP2. Alternatively, the touch sensors and their corresponding first and second opening areas OA1 and OA2 can have various shapes, such a circular shape, an oval shape, a triangular shape, a rounded triangular shape, polygon shape, etc.

When the corner has a right angle, the first undercut structure UC1 and the second undercut structure UC2 are difficult to maintain an undercut shape at the corner, which might be vulnerable to moisture permeation. In addition, since a distance between the undercut structures UC1, UC2 and the light emitting element is the smallest at the corner, a moisture permeation path can be the shortest.

In the transparent display panel 110 according to the fourth embodiment of the present disclosure, the first undercut structure UC1 and the second undercut structure UC2 are formed with the round shape, thereby facilitating the undercut formation at the corner and increasing the moisture permeation path to the light emitting element.

According as the touch sensor electrode of the touch sensor and the cathode electrode of the light emitting element are formed at the same time by using the undercut structure, a touch process is simplified and a separate mask for manufacturing the touch sensor electrode need not be added. Accordingly, the present disclosure can realize process optimization and can reduce production energy and reduce production time.

In addition, the first undercut structure can be formed without loss of light transmittance by forming the first undercut structure using the organic pattern and the plurality of inorganic layers made of the transparent material.

Also, the planarization layer provided in the non-transmission area may not overlap with the opening area of the plurality of inorganic layers. Accordingly, it is possible to prevent the moisture from permeating into the lower surface of the planarization film, and to prevent the moisture H2O included in the filler from being transferred to the light emitting element.

Also, according to the present disclosure, the organic pattern for the undercut structure is spaced apart from the planarization film that overlaps with the plurality of subpixels. Thus, even if the moisture included in the filler permeates into the organic pattern, the moisture may not be transmitted to the light emitting element.

In addition, the first undercut structure according to the present disclosure includes the plurality of undercuts, thereby reducing a short circuit defect rate between the cathode electrode for forming the light emitting element and the touch sensor electrode for forming the touch sensor, thus increasing manufacturing yield and extending the lifespan of the device.

According to the present disclosure, the dummy touch sensor electrode is provided between the touch sensor and the light emitting element, thereby preventing or minimizing generation of parasitic capacitance between the touch sensor and components of the light emitting element.

In addition, according to the present disclosure, as the parasitic capacitance affecting the touch sensor is reduced, the ratio of touch signal to noise becomes high, whereby it is possible to overcome the ghost touch defect. Accordingly, the present invention can improve a touch recognition rate and improve touch sensing accuracy.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A display device with a touch sensor, the display device comprising:
- a plurality of subpixels disposed in a substrate, the plurality of subpixels including a light emitting element with an anode electrode, a light emitting layer, and a cathode electrode;
- a first area provided in the substrate, wherein the first area includes a non-light emission area;
- a second area provided in the substrate, wherein the second area includes a transmissive area;
- a third area provided in the substrate, wherein the third area includes a light emission area disposed between adjacent non-light emission areas;
- an opening area disposed on the second area;
- a driving transistor including an active layer, a gate electrode, a source electrode, and a drain electrode, and disposed in the light emission area;
- a planarization layer on the driving transistor, wherein the light emitting element is disposed on the planarization layer;
- a bank on the anode electrode;
- an encapsulation layer on the light emitting element, wherein the encapsulation layer includes at least one inorganic layer and at least one organic film;
- color filters in each of the plurality of subpixels on the encapsulation layer; and
- a black matrix between the color filters,
- wherein the black matrix overlaps the bank, and
- wherein an at least a portion of the cathode electrode is separated by the opening area provided in the second area.

2. The display device according to claim 1, further comprising a touch sensor disposed in the second area of the substrate, the touch sensor includes a touch sensor electrode.

3. The display device according to claim 2, wherein the opening area separates the cathode electrode of the light emitting element from the touch sensor electrode of the touch sensor, the opening area being disposed in the second area of the substrate.

4. The display device according to claim 2, further comprising an undercut structure including:
- a plurality of inorganic layers disposed in the second area of the substrate; and an organic pattern disposed on an edge area of the plurality of inorganic layers, the organic pattern being spaced apart from the plurality of subpixels.

5. The display device according to claim 2, wherein the touch sensor electrode is disposed on the same layer as the cathode electrode.

6. The display device according to claim 2, wherein the touch sensor electrode is disposed in the second area of the substrate.

7. The display device according to claim 1, wherein the opening area separates the light emitting layer of the light emitting element in the first area from the light emitting layer of the light emitting element in the second area.

8. The display device according to claim 4, wherein the opening area is a gap area by patterning the plurality of inorganic layers and the organic pattern.

9. The display device according to claim 1, wherein the opening area is an undercut structure.

10. The display device according to claim 1, wherein the active layer includes an oxide-based semiconductor material.

11. The display device according to claim 4, wherein the planarization layer is disposed between the anode electrode of the light emitting element and the substrate in the first area, and wherein the planarization layer is spaced apart from the organic pattern by the undercut structure.

12. The display device according to claim 4, wherein the organic pattern is disposed on a same layer as the planarization layer, and wherein the planarization layer is disposed on the plurality of inorganic layers in the first area.

13. The display device according to claim 1, wherein the planarization layer does not overlap with the opening area.

14. The display device according to claim 4, wherein the opening area includes a first opening area at least partially overlapping with the edge area of the touch sensor electrode, wherein the organic pattern includes a first organic pattern disposed over the plurality of inorganic layers in an area overlapping with the touch sensor and at least partially overlapping with the first opening area, and wherein the undercut structure includes a first undercut formed in an area where the first organic pattern overlaps with at least a portion of the first opening area.

15. The display device according to claim 4, wherein the undercut structure includes a plurality of undercuts.

16. The display device according to claim 14, wherein the opening area further includes a second opening area disposed between the first area and the first opening area, and wherein the organic pattern includes a second organic pattern disposed over the plurality of inorganic layers in an area between the first opening area and the second opening area.

17. The display device according to claim 16, wherein the second organic pattern has a closed loop shape in a plan view.

18. The display device according to claim 16, further comprising a dummy touch sensor disposed between the plurality of subpixels and the touch sensor, the dummy touch sensor including a dummy touch sensor electrode disposed over the second organic pattern.

19. The display device according to claim 18, wherein the cathode electrode, the touch sensor electrode, and the dummy touch sensor electrode are disposed on a same layer.

20. The display device according to claim 16, wherein the undercut structure includes:

a second undercut in an area where the second organic pattern overlaps with at least a portion of the first opening area, and a third undercut in an area where the second organic pattern overlaps with at least a portion of the second opening area.

21. The display device according to claim 16, wherein the second organic pattern surrounds the first organic pattern and is spaced apart from the first organic pattern.

22. The display device according to claim 18, wherein the dummy touch sensor includes:

a first dummy touch sensor having a first dummy touch sensor electrode disposed over an upper surface of the second organic pattern, and a second dummy touch sensor having a second dummy touch sensor electrode disposed in the first opening area, wherein the first dummy touch sensor electrode and the second dummy touch sensor electrode are both electrically separated from the touch sensor electrode.

23. The display device according to claim 22, wherein the second dummy touch sensor electrode is electrically connected to the cathode electrode in the light emitting element.

24. The display device according to claim 23, wherein the undercut structure includes:

a second undercut in an area where the second organic pattern overlaps with at least a portion of the first opening area, and a third undercut in an area where the second organic pattern overlaps with at least a portion of the second opening area, further comprising:

a common power line extending in a first direction in the first area;

a first power connection portion disposed between the common power line and the third undercut and electrically connecting the common power line with the cathode electrode; and a second power connection portion electrically connecting the first power connection portion with the second dummy touch sensor electrode.

25. The display device according to claim 2, wherein the opening area separates the bank from the second area.

* * * * *